(12) United States Patent
Wu et al.

(10) Patent No.: US 11,062,960 B2
(45) Date of Patent: Jul. 13, 2021

(54) SHARED CONTACT TRENCH COMPRISING DUAL SILICIDE LAYERS AND DUAL EPITAXIAL LAYERS FOR SOURCE/DRAIN LAYERS OF NFET AND PFET DEVICES

(71) Applicant: International Business Machines Corporation, Armonk, NY (US)

(72) Inventors: Heng Wu, Guilderland, NY (US); Kangguo Cheng, Schenectady, NY (US); Junli Wang, Slingerlands, NY (US); Zuoguang Liu, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 16/599,723

(22) Filed: Oct. 11, 2019

(65) Prior Publication Data
US 2020/0058563 A1 Feb. 20, 2020

Related U.S. Application Data

(62) Division of application No. 16/104,422, filed on Aug. 17, 2018, now Pat. No. 10,566,246.

(51) Int. Cl.
| | |
|---|---|
| *H01L 21/8238* | (2006.01) |
| *H01L 21/02* | (2006.01) |
| *H01L 29/45* | (2006.01) |
| *H01L 29/66* | (2006.01) |
| *H01L 21/768* | (2006.01) |
| *H01L 27/092* | (2006.01) |
| *H01L 21/3105* | (2006.01) |

(Continued)

(52) U.S. Cl.
CPC ........... *H01L 21/823871* (2013.01); *H01L 21/02063* (2013.01); *H01L 21/02068* (2013.01); *H01L 21/76802* (2013.01); *H01L 21/76834* (2013.01); *H01L 21/76846* (2013.01); *H01L 21/76889* (2013.01); *H01L 21/76897* (2013.01); *H01L 21/823821* (2013.01); *H01L 27/0924* (2013.01); *H01L 29/45* (2013.01); *H01L 29/665* (2013.01); *H01L 29/6653* (2013.01); *H01L 29/6656* (2013.01); *H01L 21/0274* (2013.01);
(Continued)

(58) Field of Classification Search
None
See application file for complete search history.

(56) References Cited

U.S. PATENT DOCUMENTS

| | | | |
|---|---|---|---|
| 9,059,096 B2 | 6/2015 | Guillorn et al. | |
| 9,117,692 B2 | 8/2015 | Park et al. | |

(Continued)

*Primary Examiner* — David E Graybill
(74) *Attorney, Agent, or Firm* — Erik Johnson; Ryan, Mason & Lewis, LLP

(57) ABSTRACT

Devices and methods are provided for fabricating shared contact trenches for source/drain layers of n-type and p-type field-effect transistor devices, wherein the shared contact trenches include dual silicide layers and dual epitaxial layers. For example, a semiconductor device includes first and second field-effect transistor devices having respective first and second source/drain layers, and a shared contact trench, wherein the first and second source/drain layers are disposed adjacent to each other within the shared contact trench, and are commonly connected to each other by the shared contact trench. The shared contact trench includes a first silicide contact layer disposed on the first source/drain layer, and a second silicide contact layer disposed on the second source/drain layer, wherein the first and second silicide contact layers comprise different silicide materials, and a metallic fill layer disposed on the first and second silicide contact layers.

20 Claims, 20 Drawing Sheets

(51) Int. Cl.
- H01L 29/78 (2006.01)
- H01L 21/027 (2006.01)
- H01L 21/321 (2006.01)
- H01L 27/11 (2006.01)
- H01L 21/311 (2006.01)
- H01L 29/165 (2006.01)

(52) U.S. Cl.
CPC .. *H01L 21/02532* (2013.01); *H01L 21/02576* (2013.01); *H01L 21/02579* (2013.01); *H01L 21/31053* (2013.01); *H01L 21/31116* (2013.01); *H01L 21/3212* (2013.01); *H01L 21/7684* (2013.01); *H01L 21/823814* (2013.01); *H01L 21/823828* (2013.01); *H01L 27/1104* (2013.01); *H01L 29/165* (2013.01); *H01L 29/66545* (2013.01); *H01L 29/7848* (2013.01)

(56) References Cited

U.S. PATENT DOCUMENTS

| | | | |
|---|---|---|---|
| 9,177,805 B2 | 11/2015 | Bouche et al. |
| 9,177,810 B2 | 11/2015 | Basker et al. |
| 9,293,462 B2 | 3/2016 | Koh et al. |
| 9,431,296 B2 | 8/2016 | Basker et al. |
| 9,484,348 B2 | 11/2016 | Basker et al. |
| 9,768,077 B1 | 9/2017 | Adusumilli et al. |
| 9,812,453 B1 | 11/2017 | Mulfinger et al. |
| 9,876,094 B2 | 1/2018 | Bae et al. |
| 9,978,749 B2 | 5/2018 | Li |
| 10,062,692 B1 | 8/2018 | Ray et al. |
| 10,084,094 B1 | 9/2018 | Cheng et al. |
| 10,262,904 B2 | 4/2019 | Gluschenkov et al. |
| 2012/0119302 A1 | 5/2012 | Pei et al. |
| 2013/0187171 A1 | 7/2013 | Guillorn et al. |
| 2014/0306291 A1 | 10/2014 | Alptekin et al. |
| 2015/0028423 A1 | 1/2015 | Park et al. |
| 2015/0214058 A1 | 7/2015 | Basker et al. |
| 2015/0214059 A1 | 7/2015 | Bouche et al. |
| 2015/0214228 A1 | 7/2015 | Koh et al. |
| 2015/0303118 A1 | 10/2015 | Wang et al. |
| 2015/0380305 A1 | 12/2015 | Basker et al. |
| 2016/0099342 A1 | 4/2016 | Basker et al. |
| 2016/0343825 A1 | 11/2016 | Bae et al. |
| 2016/0351709 A1 | 12/2016 | Nishikawa et al. |
| 2017/0221892 A1 | 8/2017 | Li |
| 2018/0277936 A1 | 8/2018 | Ray et al. |
| 2018/0269324 A1 | 9/2018 | Cheng et al. |
| 2018/0277446 A1 | 9/2018 | Gluschenkov et al. |

100

100

100

200

200

SHARED CONTACT TRENCH COMPRISING DUAL SILICIDE LAYERS AND DUAL EPITAXIAL LAYERS FOR SOURCE/DRAIN LAYERS OF NFET AND PFET DEVICES

TECHNICAL FIELD

This disclosure generally relates to semiconductor fabrication techniques and, in particular, techniques for fabricating shared contact trenches for field-effect transistor (FET) devices.

BACKGROUND

When scaling for next generation complementary metal-oxide semiconductor (CMOS) devices in connection with increased miniaturization, including, for example, very-large-scale integration (VLSI), middle-of-the-line (MOL) resistance can be a critical issue affecting device performance. Scaling of CMOS devices calls for independently reducing contact resistance of both n-type field-effect transistors (NFETs) and p-type field-effect transistors (PFETs), which requires different silicides for NFETs and PFETs, to independently achieve low contact resistance on both an NFET and a PFET, respectively.

CMOS technology is widely utilized to fabricate circuits for various types of applications. For example, for memory applications, CMOS technology is utilized to fabricate Static Random-Access Memory (SRAM), which is a critical circuit component in technology development. A 6-transistor SRAM cell comprises two bistable, cross-coupled CMOS inverters to store a data bit, and two access MOSFETs to access the stored data for read and write operations. Each CMOS inverter is formed of a serially connected NFET and PFET device, which have a commonly connected source/drain layer and commonly connected gate regions. Technology nodes of 7 nm and beyond will require an increasingly tighter SRAM layout using shared trench silicide (TS) contact trenches to commonly connect source/drain layers of CMOS devices. For these applications, low contact resistance (e.g., $<2.5\times10^{-9}$ $\Omega\cdot cm^{-2}$) is crucial to device performance. By using dual trench epitaxial and silicide layers within TS contact trenches, the contact resistance for the common source/drain layers of NFET and PFET devices can be optimized and reduced below $1.0\times10^{-9}$ $\Omega\cdot cm^{-2}$. However, current TS trench fabrication techniques do not provide for different (dual) epitaxial and silicide layers to be fabricated for shared TS trenches for common source/drain layers of NFET and PFET devices.

SUMMARY

Embodiments of the invention include methods for fabricating shared contact trenches for NFET and PFET devices, which comprise dual silicide layers and dual epitaxial layers, as well as semiconductor devices in which source/drain layers of NFET and PFET devices are commonly connected in shared contact trenches comprising dual silicide layers and dual epitaxial layers.

For example, in one embodiment, a method for fabricating a semiconductor device comprises: etching a first contact opening in an insulating layer to expose a first source/drain layer of a first field-effect transistor device; forming a first stack of layers in the first contact opening over the first source/drain layer, wherein the stack of layers comprises a first epitaxial contact layer formed on the first source/drain layer, a first metallic contact liner layer formed on the first epitaxial contact layer, and a first metallic fill layer formed over the first metallic contact liner layer; etching a second contact opening in the insulating layer to expose a second source/drain layer of a second field-effect transistor device, wherein the second contact opening is formed adjacent to the first stack of layers in the first contact opening; forming a second stack of layers in the second contact opening over the second source/drain layer, wherein the second stack of layers comprises a second epitaxial contact layer formed on the second source/drain layer, a second metallic contact liner layer formed on the second epitaxial contact layer, and a second metallic fill layer formed over the second metallic contact liner layer; and performing a thermal anneal process to induce a reaction between the first epitaxial contact layer and the first metallic contact liner layer to form a first silicide contact layer, and between the second epitaxial contact layer and the second metallic contact liner layer to form a second silicide contact layer, wherein the first and second silicide contact layers comprise different silicide materials. The first and second silicide contact layers and the first and second metallic fill layers form a shared contact trench for the first and second source/drain layers of the first and second field-effect transistor devices.

In another embodiment, a method for fabricating a semiconductor device comprises: etching a first contact opening in an insulating layer to expose a first source/drain layer of a first field-effect transistor device and a second source/drain layer of a second field-effect transistor device; forming a first stack of layers in the first contact opening over the first and second source/drain layers, wherein the first stack of layers comprises a first epitaxial contact layer formed on the first and second source/drain layers, a first metallic contact liner layer formed on the first epitaxial contact layer, and a first metallic fill layer formed over the first metallic contact liner layer; etching a second contact opening in the first stack of layers to expose the second source/drain layer of the second field-effect transistor device; forming a second stack of layers in the second contact opening over the second source/drain layer, wherein the second stack of layers comprises a second epitaxial contact layer formed on the second source/drain layer, a second metallic contact liner layer formed on the second epitaxial contact layer, and a second metallic fill layer formed over the second metallic contact liner layer; and performing a thermal anneal process to induce a reaction between the first epitaxial contact layer and the first metallic contact liner layer to form a first silicide contact layer, and between the second epitaxial contact layer and the second metallic contact liner layer to form a second silicide contact layer, wherein the first and second silicide contact layers comprise different silicide materials. The first and second silicide contact layers and the first and second metallic fill layers form a shared contact trench for the first and second source/drain layers of the first and second field-effect transistor devices.

Another embodiment includes a semiconductor device comprising: a first field-effect transistor device and a second field-effect transistor device disposed on a substrate, wherein the first field-effect transistor device comprises a first source/drain layer, and wherein the second field-effect transistor device comprises a second source/drain layer; and a shared contact trench, wherein the first and second source/drain layers are disposed adjacent to each other within the shared contact trench, and are commonly connected to each other by the shared contact trench. The shared contact trench comprises: a first silicide contact layer disposed on the first source/drain layer of the first field-effect transistor device; a second silicide contact layer disposed on the second source/ drain layer of the second field-effect transistor device, wherein the first and second silicide contact layers comprise different silicide materials; and a metallic fill layer disposed on the first and second silicide contact layers.

In one embodiment, the first and second field-effect transistor devices comprise n-type and p-type fin field-effect transistor devices, and wherein the first and second source/drain layers comprise epitaxial layers disposed on adjacent vertical semiconductor fins. In one embodiment, one of the first and second silicide contact layers comprises titanium silicide, and wherein the other of the first and second silicide contact layers comprises one of nickel silicide, a platinum silicide, nickel-platinum silicide, and cobalt silicide.

Other embodiments will be described in the following detailed description of embodiments, which is to be read in conjunction with the accompanying figures.

BRIEF DESCRIPTION OF THE DRAWINGS

FIGS. 1-10 schematically illustrate a method for fabricating shared contact trenches for NFET and PFET devices, which comprise dual silicide layers and dual epitaxial contact layers, according to an embodiment of the invention, wherein:

FIG. 1 is a schematic cross-sectional side view of a semiconductor device at an intermediate stage of fabrication comprising a semiconductor substrate, a plurality of PFET devices and NFET devices comprising vertical semiconductor fins and epitaxial source/drain layers formed on upper regions of the vertical semiconductor fins, an isolation layer, an interlayer dielectric (ILD) layer, and a plurality of contact openings formed in the ILD layer to expose the source/drain layers of the NFET devices;

FIG. 2 is a schematic cross-sectional side view of the semiconductor device of FIG. 1 after forming a first epitaxial contact layer, a first metallic contact liner layer, and a first metallic fill layer over the source/drain layers of the NFET devices within the contact openings of the ILD layer;

FIG. 3 is a schematic cross-sectional side view of the semiconductor device of FIG. 2 after recessing the first metallic fill layers and forming capping layers on recessed surfaces of the first metallic fill layers;

FIG. 4 is a schematic cross-sectional side view of the semiconductor device of FIG. 3 after patterning the ILD layer to form contact openings to expose the source/drain layers of the PFET devices;

FIG. 5 is a schematic cross-sectional side view of the semiconductor device of FIG. 4 after forming a conformal sacrificial spacer layer over the surface of the semiconductor device;

FIG. 6 is a schematic cross-sectional side view of the semiconductor device of FIG. 5 after patterning the conformal sacrificial spacer layer to form sacrificial sidewall spacers on the sidewalls of the contact openings of the ILD layer;

FIG. 7 is a schematic cross-sectional side view of the semiconductor device of FIG. 6 after forming second epitaxial contact layers on the source/drain layers of the PFET devices exposed within the contact openings of the ILD layer;

FIG. 8 is a schematic cross-sectional side view of the semiconductor device of FIG. 7 after removing the sacrificial sidewall spacers on the sidewalls of the contact openings of the ILD layer;

FIG. 9 is a schematic cross-sectional side view of the semiconductor device of FIG. 8 after forming second metallic contact liner layers and second metallic fill layers over the epitaxial contact layers of the source/drain layers of the PFET devices within the contact openings of the ILD layer to form first and second shared contact trenches; and FIG. 10 is a schematic cross-sectional side view of the semiconductor device of FIG. 9 after performing a thermal anneal process to form dual silicide contact layers in the first and second shared contact trenches.

FIGS. 11-20 schematically illustrate a method for fabricating shared contact trenches for NFET and PFET devices, which comprise dual silicide layers and dual epitaxial contact layers, according to another embodiment of the invention, wherein:

FIG. 11 is a schematic cross-sectional side view of a semiconductor device at an intermediate stage of fabrication comprising a semiconductor substrate, a plurality of PFET devices and NFET devices comprising vertical semiconductor fins and epitaxial source/drain layers formed on upper regions of the vertical semiconductor fins, an isolation layer, an ILD layer, and a plurality of contact openings formed in the ILD layer to expose the source/drain layers of the PFET devices and the NFET devices.

FIG. 12 is a schematic cross-sectional side view of the semiconductor device of FIG. 11 after forming first epitaxial contact layers on the source/drain layers of the PFET and NFET devices exposed at the bottom of the contact openings of the ILD layer;

FIG. 13 is a schematic cross-sectional side view of the semiconductor device of FIG. 12 after forming a first metallic contact liner layer and a first metallic fill layer within the contact openings of the ILD layer to form first and second shared contact trenches;

FIG. 14 is a schematic cross-sectional side view of the semiconductor device of FIG. 13 after recessing the first metallic fill layers and forming capping layers on recessed surfaces of the first metallic fill layers;

FIG. 15 is a schematic cross-sectional side view of the semiconductor device of FIG. 14 after forming contact openings in the first and second shared contact trenches to expose the source/drain layers of the NFET devices;

FIG. 16 is a schematic cross-sectional side view of the semiconductor device of FIG. 15 after forming a conformal sacrificial spacer layer over the surface of the semiconductor device;

FIG. 17 is a schematic cross-sectional side view of the semiconductor device of FIG. 16 after patterning the conformal sacrificial spacer layer to form sacrificial sidewall spacers on the sidewalls of the contact openings of the first and second shared contact trenches, and after forming second epitaxial contact layers on the source/drain layers of the NFET devices exposed within the contact openings of the first and second shared contact trenches;

FIG. 18 is a schematic cross-sectional side view of the semiconductor device of FIG. 17 after removing the sacrificial sidewall spacers on the sidewalls of the contact openings of the first and second shared contact trenches;

FIG. 19 is a schematic cross-sectional side view of the semiconductor device of FIG. 18 after forming second metallic contact liner layers and second metallic fill layers over the second epitaxial contact layers of the NFET devices in the first and second shared contact trenches; and FIG. 20 is a schematic cross-sectional side view of the semiconductor device of FIG. 19 after performing a thermal anneal process to form dual silicide contact layers in the first and second shared contact trenches.

DETAILED DESCRIPTION

Figure 1:
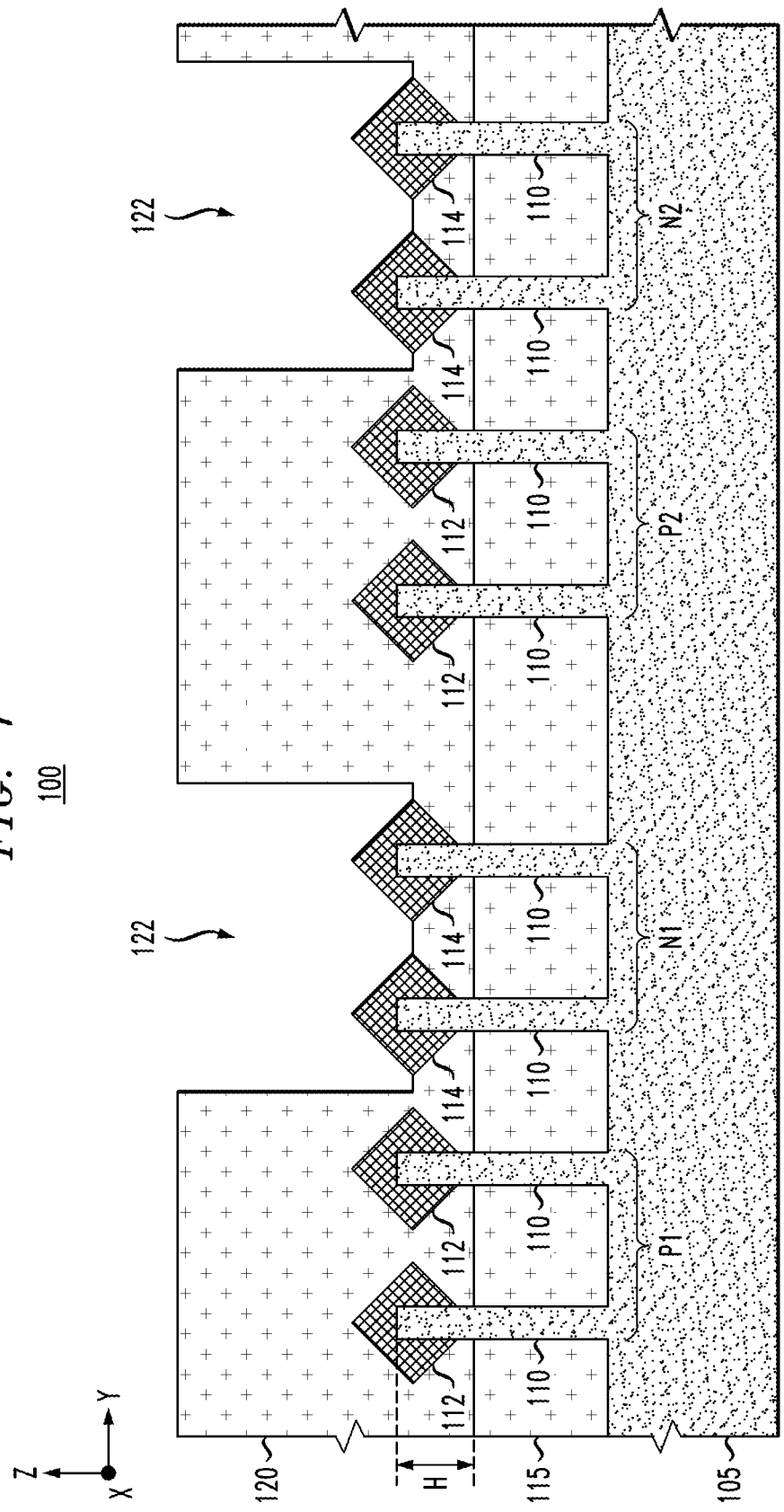

Embodiments will now be described in further detail with regard to methods for fabricating shared contact trenches for NFET and PFET devices, which comprise dual silicide layers and dual epitaxial layers, as well as semiconductor devices in which source/drain layers of NFET and PFET devices are commonly connected in shared contact trenches comprising dual silicide layers and dual epitaxial layers. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. To provide spatial context, XYZ Cartesian coordinates are shown in the drawings of semiconductor structures. It is to be understood that the term "vertical" as used herein denotes a Z-direction of the Cartesian coordinates shown in the drawings, and that the terms "horizontal" or "lateral" as used herein denote an X-direction and/or a Y-direction of the Cartesian coordinates shown in the drawings, which is perpendicular to the Z-direction.

FIGS. 1-10 schematically illustrate a method for fabricating shared contact trenches for NFET and PFET devices, which comprise dual silicide layers and dual epitaxial contact layers, according to an embodiment of the invention. To begin, FIG. 1 is a schematic cross-sectional side view of a semiconductor device 100 at an intermediate stage of fabrication comprising a semiconductor substrate 105, and a plurality of PFET devices P1 and P2 and NFET devices N1 and N2 formed on the semiconductor substrate 105. The PFET devices P1 and P2 and NFET devices N1 and N2 comprise vertical semiconductor fins 110 formed on the substrate 105, and epitaxial source/drain layers 112 and 114 formed on upper regions of the vertical semiconductor fins 110. The semiconductor device 100 further comprises an isolation layer 115 (e.g., shallow trench isolation (STI) layer), and an insulation layer 120 (or interlayer dielectric (ILD) layer). A plurality of contact openings 122 are formed in the ILD layer 120 to expose the source/drain layers 114 of the NFET devices N1 and N2.

In the exemplary embodiment of FIG. 1, the PFET devices P1 and P2 and NFET devices N1 and N2 are fin-type FET devices (FinFETs). As is well-known in the art, a FinFET device comprises a three-dimensional fin-shaped FET structure which includes at least one vertical semiconductor fin structure formed on a substrate, a gate structure formed over a portion of the vertical semiconductor fin, and source/drain layers formed on portions of the vertical semiconductor fin which extend from both sides of the gate structure. The portion of the vertical semiconductor fin that is covered by the gate structure between the source/drain layers comprises a channel region of the FinFET device. The gate structures of FinFET devices can be formed using various techniques. For example, a FinFET gate structure can be fabricated using a "gate-last" process, which involves, for example, forming a dummy gate structure and a gate spacer over a portion of a vertical semiconductor fin, fabricating other FinFET device elements (e.g., source/drain layers), and then replacing the dummy gate structure with a metal gate structure using a replacement metal gate (RMG) process.

The exemplary embodiment shown in FIG. 1 illustrates an intermediate stage of fabrication following a RMG process to form metal gate structures (not shown) of the PFET and NFET devices, and the deposition and lithographic patterning of the ILD layer 120 to form the contact openings 122. Moreover, in the example embodiment of FIG. 1, each PFET device P1 and P2 and NFET device N1 and N2 is a multi-fin FET device comprising at least two vertical semiconductor fins 110. The vertical semiconductor fins 110 extend in a X-direction (which is perpendicular to a plane of the drawing page). FIG. 1 schematically illustrates a cross-sectional view of the semiconductor device 100 along a Y-direction which is parallel to the longitudinal direction in which metal gate structures (not shown) extend. In this regard, FIG. 1 is a cross-section view of the semiconductor device 100 in along source/drain layers which are adjacent to metal gate structures.

The semiconductor device 100 shown in FIG. 1 can be fabricated using known semiconductor fabrication techniques and suitable semiconductor materials. For example, the semiconductor substrate 105 is illustrated as a generic substrate layer, and may comprise various structures and layers of semiconductor material. In one embodiment, the semiconductor substrate 105 comprises a bulk semiconductor substrate (e.g., wafer) formed of, e.g., silicon (Si), or other types of semiconductor substrate materials that are commonly used in bulk semiconductor fabrication processes such as germanium (Ge), a silicon-germanium (SiGe) alloy, silicon carbide (SiC), silicon-germanium carbide alloy, or compound semiconductor materials (e.g. Group III-V or Group II-VI, etc.). Non-limiting examples of Group III-V compound semiconductor materials include gallium arsenide, indium arsenide, and indium phosphide. In another embodiment, the semiconductor substrate 105 comprises a SOI (silicon on insulator) substrate, which comprises an insulating layer (e.g., oxide layer) disposed between a base substrate layer (e.g., silicon substrate) and an active semiconductor layer (e.g., active Si or SiGe layer) in which active circuit components are formed as part of a FEOL (front end of line) structure.

The vertical semiconductor fins 110 and isolation layer 115 can be fabricated using various methods. For example, for bulk and SOI substrate embodiments, the vertical semiconductor fins 110 can be formed by patterning an active silicon layer (e.g., crystalline silicon, crystalline SiGe, Group III-V compound semiconductor material, etc.) at the surface of a bulk semiconductor substrate or the SOI substrate to form a pattern of vertical semiconductor fins in different device regions across the semiconductor wafer. In one embodiment, the vertical semiconductor fins 110 may be patterned from a crystalline SiGe layer that is epitaxially grown on top of a bulk silicon substrate or a bulk germanium substrate. A crystalline SiGe layer that is formed using an epitaxial growth process may comprise a relaxed SiGe layer or a strained SiGe layer. As is known in the art, strain engineering is utilized to enhance the carrier mobility for MOS transistors, wherein different types of Si—SiGe heterostructures can be fabricated to obtain and/or optimize different properties for CMOS FET devices. For example, silicon can be epitaxially grown on a SiGe substrate layer to form a strained Si layer. Moreover, a strained SiGe layer can be epitaxially grown on silicon substrate layer. A strained-Si/relaxed-SiGe structure produces tensile strain which primarily improves electron mobility for n-type FET devices, while a strained-SiGe/relaxed-Si structure produces a compressive strain which primarily improves hole mobility for p-type FET devices.

After forming the vertical semiconductor fins 110, a layer of insulating material can be deposited to cover the vertical semiconductor fins 110, and then planarized (via chemical-mechanical planarization (CMP)) down to the top of the vertical semiconductor fins 110, and then further recessed using an etch-back process (e.g., selective RIE process) to form the isolation layer 115. As shown in FIG. 1, the layer of insulating material is etched down to a target level to expose upper portions of the vertical semiconductor fins 110, which define a baseline active fin height H for the PFET devices P1, P2 and NFET devices N1, N2.

Following formation of the isolation layer 115, dummy gate structures and gate sidewall spacers are fabricated using known process flows, the details of which are not necessary for understanding the invention. Following fabrication of the gate sidewall spacers, the process flow continues with forming the source/drain layers 112 and 114 on exposed regions of the vertical semiconductor fins 110 which extend from the sidewalls of the dummy gate structures. It is to be understood that the term "source/drain layer" as used herein means that a given source/drain layer can be either a source layer or drain layer for the given FinFET device, depending on the application.

In one embodiment, the source/drain layers 112 and 114 are formed by growing epitaxial semiconductor material on the exposed surfaces of the vertical semiconductor fins 110 adjacent to the dummy gate structures. In the example embodiment shown in FIG. 1, the source/drain layers 112 and 114 comprise faceted epitaxial layers that are grown on exposed upper surfaces of the vertical semiconductor fins 110 (wherein the source/drain layers 112 and 114 comprise a trapezoidal or diamond-shaped structure). The type of epitaxial material and doping used to form the source/drain layers 112 of the PFET devices P1, P2 and the source/drain layers 114 of the NFET devices N1, N2, will vary depending on whether the FinFET devices are P-type or N-type devices. The source/drain layers 112 and 114 formed by epitaxially growing crystalline semiconductor material on (and slightly within) the exposed surfaces of the semiconductor fins 115 using known techniques, such as chemical vapor deposition (CVD), metal-organic chemical vapor deposition (MOCVD), low pressure chemical vapor deposition (LPCVD), molecular beam epitaxy (MBE), vapor-phase epitaxy (VPE), liquid-phase epitaxy (LPE), metal organic molecular beam epitaxy (MOMBE), rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), metal-organic chemical vapor deposition (MOCVD), or other known epitaxial growth techniques.

The type of epitaxial semiconductor material that is used to form source/drain layers 112 and 114 on the exposed portions of the vertical semiconductor fins 110 will vary depending on various factors including, but are not limited to, the type of material of the vertical semiconductor fins 110, the device type (e.g., n-type or p-type) of the FINFET device, etc. Moreover, the source/drain layers 112 and 114 can be doped using standard doping techniques. For example, the doping of the source/drain layers can be performed in-situ during the epitaxial growth of the source/drain layers, or ex-situ by ion implantation. For example, the source/drain layers 112 of the PFET devices P1, P2 can be doped with Group III elements, and the source/drain layers 114 of the NFET devices N1, N2, can be doped with Group V elements. Typical dopants include Boron, Arsenic, Phosphorus, Gallium, Antimony, etc. For example, Boron is a p-type dopant, whereas Phosphorus is an n-type dopant. In one embodiment, the source/drain layers 112 for the PFET devices P1 and P2 comprise boron-doped SiGe epitaxial layers that are epitaxially grown on the upper portions of the vertical semiconductor fins 110 in the PFET regions, and the source/drain layers 114 of the NFET devices N1 and N2 comprise silicon phosphorous (SiP) epitaxial layers that are epitaxially grown on the upper portions of the vertical semiconductor fins 110 in the NFET regions.

Following fabrication of the source/drain layers 112 and 114, the ILD layer 120 is formed, for example, by depositing one or more layers of insulating material over the surface of the semiconductor substrate to cover the dummy gate structures, and then planarizing the surface of the semiconductor substrate down to a level which exposes the upper surface of the dummy gate structures. The ILD layer 120 can be formed using suitable dielectric materials including, but not limited to, silicon oxide, hydrogenated silicon carbon oxide (SiCOH), SiCH, SiCNH, or other types of silicon based low-k dielectrics (e.g., k less than about 4.0), porous dielectrics, or known ULK (ultra-low-k) dielectric materials (with k less than about 2.5). For example, the ILD layer 120 may comprise a single deposited layer of insulating material, or multiple layers of insulating material (e.g., a first layer of a flowable oxide and a second layer of insulating material formed on the first layer). The ILD layer 120 may be deposited using known deposition techniques, such as, for example, atomic layer deposition (ALD), chemical vapor deposition (CVD), PECVD (plasma-enhanced CVD), physical vapor deposition (PVD), or spin-on deposition.

Following formation of the ILD layer 120, the process flow continues with a RMG process to replace the dummy gate structures with metallic gate structures. For example, in one embodiment, known RMG process flows can be utilized to remove sacrificial material (e.g., dummy gate polysilicon and dummy gate oxide layer) of the dummy gate structures, and form high-k metal gate structures high-k gate dielectric layers and metallic gate electrodes, using suitable dielectric and metallic materials.

Following the formation of the metallic gate structures, a MOL (middle of the line) process module is performed, wherein the MOL process module comprises forming a shared TS contact trench for the source/drain layers 112 and 114 of the first PFET and NFET devices P1 and N1, and a shared TS contact trench for the source/drain layers 112 and 114 of the second PFET and NFET devices P2 and N2. As an initial step, as shown in FIG. 1, the ILD layer 120 is patterned to form the contact openings 122 to expose the source/drain layers 114 of the NFET devices N1 and N2. The ILD layer 120 can be patterned using photolithographic techniques to form a photoresist mask comprising an image of the contact openings 122, and then performing a suitable directional dry etch process (e.g. Reactive Ion Etch (RIE)) to etch the ILD layer 120 and transfer the image of the photoresist mask into the ILD layer 120 to form the contact openings 122.

Figure 2:
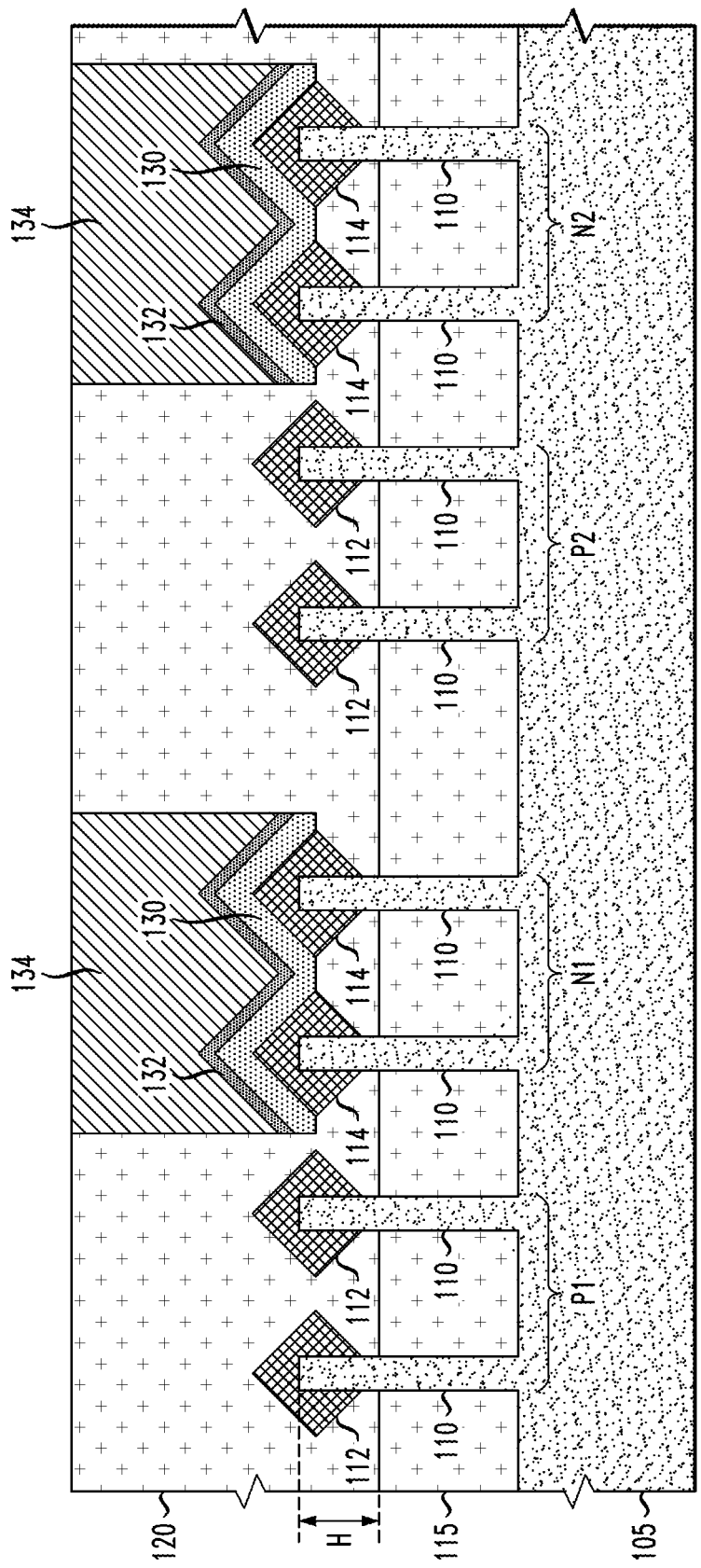

Next, FIG. 2 is a schematic cross-sectional side view of the semiconductor device of FIG. 1 after forming first epitaxial contact layers 130, first metallic contact liner layers 132, and first metallic fill layers 134 within the contact openings 122 of the ILD layer 120. The first epitaxial contact layers 130 comprise epitaxial material that is epitaxially grown on the source/drain layers 114 of the NFET devices N1 and N2. Prior to forming the first epitaxial contact layers 130, a preclean process can be performed to remove any surface impurities or oxides from the exposed surfaces of the epitaxial source/drain layers 114, which would otherwise increase the contact resistance or resistivity of the resulting trenches silicide contacts. In one embodiment, the first epitaxial contact layers 130 are formed of an epitaxial material which is the same or similar to the epitaxial material of the source/drain layers 114, but wherein the first epitaxial contact layers 130 are formed with a higher doping level than the source/drain layers 114. For example, in one embodiment, the first epitaxial contact layers 130 are formed of epitaxial SiP or epitaxial silicon arsenide (SiAs), etc., but with increased doping levels to enable the formation of lower resistivity silicide contacts. The first epitaxial contact layers 130 can be formed using methods such as those methods noted above for growing the source/drain layers 112 and 114.

The first metallic contact liner layers 132 each comprise a thin layer of metallic material which, during a subsequent thermal anneal process, combines with the first epitaxial contact layers 130 to form trench silicide layers (or metallic-semiconductor alloy layers) as part of a salicidation process. Typically, silicide contacts are formed using transition metals such as nickel (Ni), cobalt (Co), titanium (Ti), platinum (Pt), tungsten (W), tantalum (Ta), an alloy such as titanium-aluminum (TiAl) or titanium-nitride (TiN), etc., or any other suitable metallic material. For the NFET devices N1 and N2, the first metallic contact liner layers 132 are preferably formed of, e.g., Ti or TiN. According to a non-limiting embodiment of the present invention, the first metallic contact liner layers 132 are formed with a thickness in a range of about 3 nm to about 8 nm.

With this exemplary process flow, the first metallic contact liner layers 132 (or silicide metal) are deposited right after formation of the trench first epitaxial contact layers 130, which essentially enables the formation of a residue-free and defect-free epitaxial surface on which the silicide metal is deposited. The first metallic contact liner layers 132 can be deposited via ALD or CVD (in which case the first metallic contact liners 132 are conformally deposited on bottom and sidewall surfaces of the contact openings 122) or by PVD (in which case the metallic contact liners 130 are essentially deposited on the bottom of the contact openings 122).

The metallic fill layer 134 comprises a metallic material which is deposited to fill the contact openings 122. The metallic fill layer 134 comprises a metallic material including, but not limited to, tungsten (W), cobalt (Co), ruthenium (Ru), copper (Cu), or combinations thereof. The metallic fill layer 134 is formed by depositing metallic material using deposition techniques such as CVD, PECVD, PVD, ALD, radio-frequency CVD (RFCVD), molecular beam deposition (MBD), pulsed laser deposition (PLD), liquid source misted chemical deposition (LSMCD), sputtering, and/or plating. Furthermore, in some embodiments, before forming the metallic fill layer 134, a barrier layer and/or seed layer is conformally deposited to line the sidewall and bottom surfaces of the contact openings 122. For example, in one embodiment, for the contact trenches of the NFET devices, the barrier layer (or seed layer) is formed of a metallic material such as TiN or TaN. The barrier layer may be formed with a thickness in a range of about 3 nm to about 5 nm thick. The barrier layer serves to prevent the diffusion of metallic material from the metallic fill layer 134 into the ILD layer 120. A seed layer serves as a wetting layer for the metallic fill deposition process.

Following the metal deposition processes to form the metallic layers 132 and 134 (and the optional diffusion barrier layer), a planarization process (e.g., chemical mechanical polishing (CMP) process) is performed to remove the overburden metallic material from the upper surface of the ILD layer 120, which results in the semiconductor structure shown in FIG. 2. At the intermediate stage of the process as shown in FIG. 2, the shared TS contact trench for the source/drain layers 112 and 114 of the first PFET and NFET devices P1 and N1 is partially fabricated, and the shared TS contact trench for the source/drain layers 112 and 114 of the second PFET and NFET devices P2 and N2 is partially fabricated.

Figure 3:
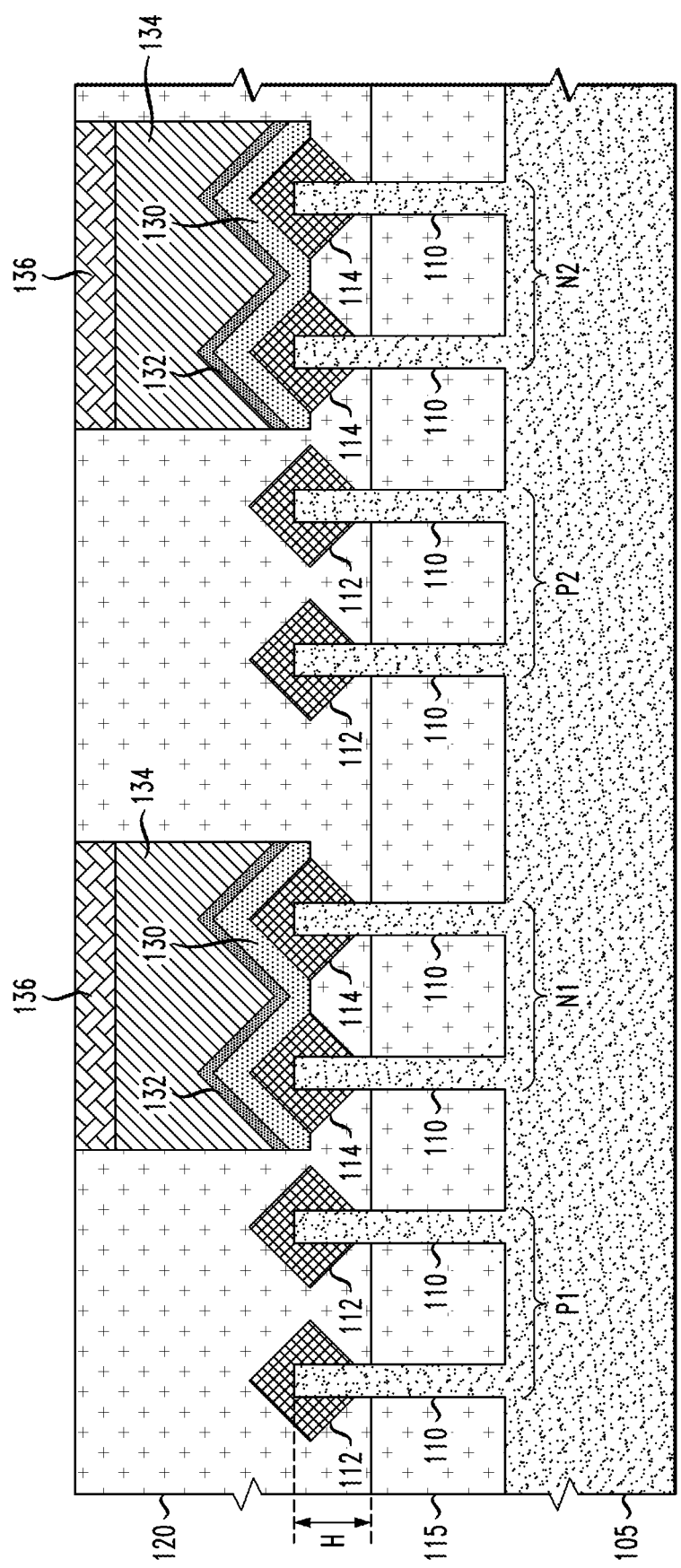

Next, FIG. 3 a schematic cross-sectional side view of the semiconductor device of FIG. 2 after recessing the metallic fill layers 134 and forming capping layers 136 on recessed surfaces of the metallic fill layers 134. In one embodiment, the capping layers 136 are formed by a process which comprises (i) performing etch processes to recess the upper surfaces of the metallic fill layers 134 down to a target depth, and (ii) depositing an insulating material to fill recessed regions above the recessed surfaces of the metallic fill layers 134. The capping layers 136 are formed using insulating/dielectric material which is suitable for the given application and which can be etched selective to the material that forms the ILD layer 120. For example, when the ILD layer 120 comprises an oxide material, the capping layers 136 can be formed of a nitride material (e.g., SiN). In other embodiments, the capping layers 136 can be formed of, e.g., silicon carbon nitride (SiCN), silicon oxynitride (SiON), boron nitride (BN), silicon boron nitride (SiBN), siliconborocarbonitride (SiBCN), silicon oxycarbonitride (SiOCN), or other similar materials.

In one embodiment, the capping layers 136 can be formed by depositing a conformal layer of insulating/dielectric material to fill the recessed regions above the recessed surfaces of the metallic fill layers 134, followed by a planarization process (e.g., CMP) to remove the overburden insulating/dielectric material down to the upper surface of the ILD layer 120. In another embodiment, the capping layers 136 can be selectively grown on top of the recessed surfaces of the metallic fill layers 134 using known selective deposition techniques. In this process, the insulating/dielectric material is selectively deposited on the recessed surfaces of the metallic fill layers 134, and not deposited on the surface of the ILD layer 120.

Figure 4:
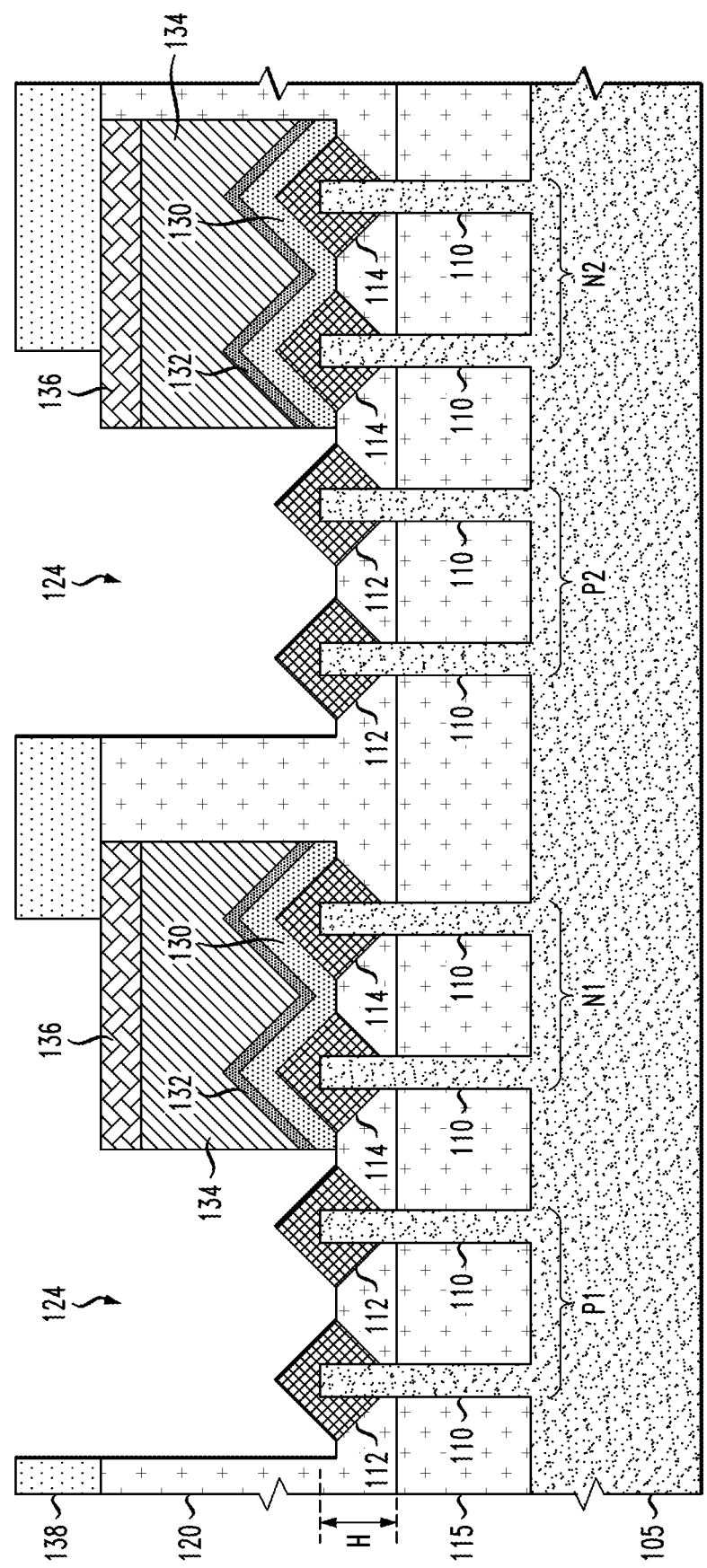

Next, FIG. 4 is a schematic cross-sectional side view of the semiconductor device of FIG. 3 after patterning the ILD layer 120 to form contact openings 124 to expose the source/drain layers 112 of the PFET devices P1 and P2. The ILD layer 120 can be patterned using photolithographic techniques to form a photoresist mask 138, and then performing a suitable directional dry etch process (e.g. RIE) to etch the exposed portions of the ILD layer 120 down to the source/drain layers 112. In this exemplary embodiment, there is a relaxed requirement in the photolithographic process as the capping layers 136 enable self-alignment of the contact openings 124. In indeed, as schematically illustrated in FIG. 4, the photoresist mask 138 is formed with a relaxed overly budget, as the openings formed in the photoresist mask 138 can overlap and expose portions of the capping layers 136. In this instance, since there is etch selectivity between the ILD layer 120 and the capping layers 136, the ILD layer 120 can be etched selective to the capping layers 136 and form the contact openings 124 in a self-aligned manner.

Figure 5:
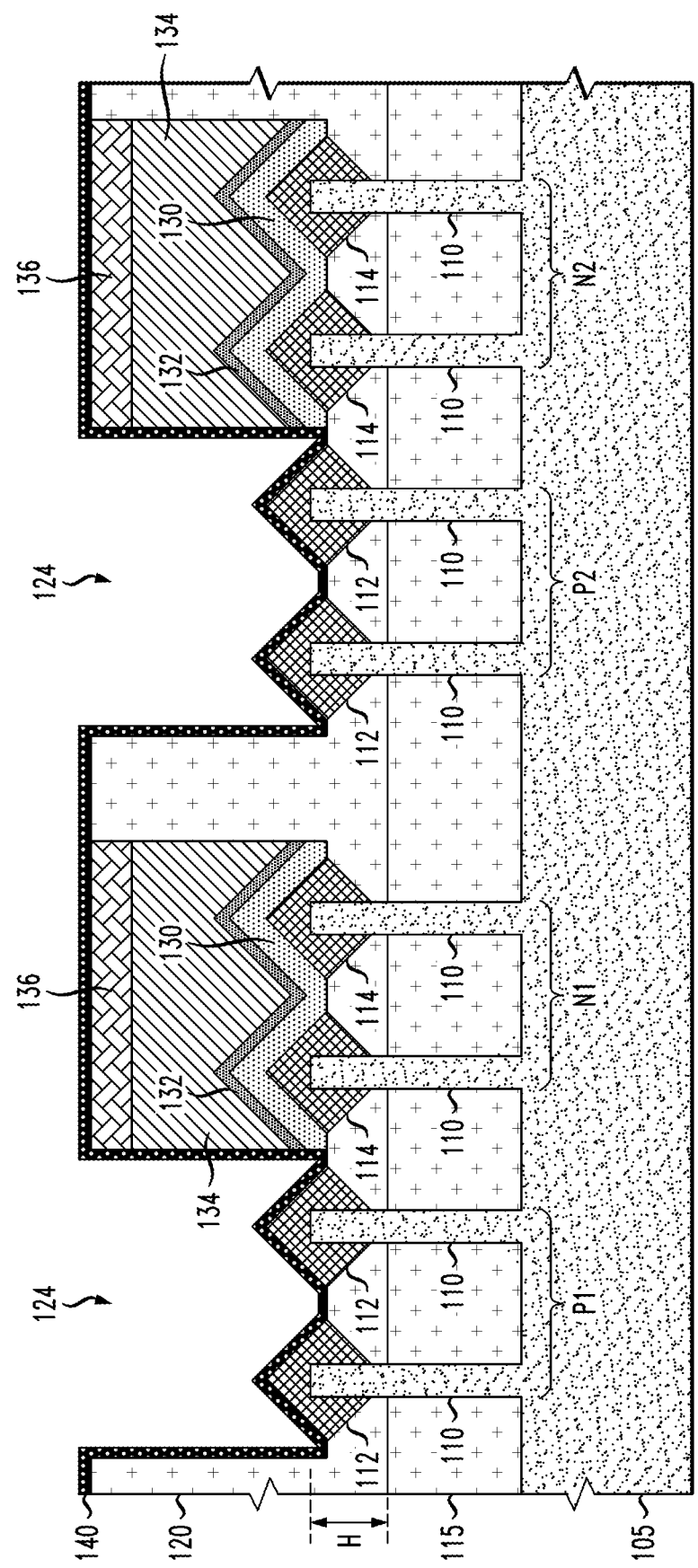
Figure 6:
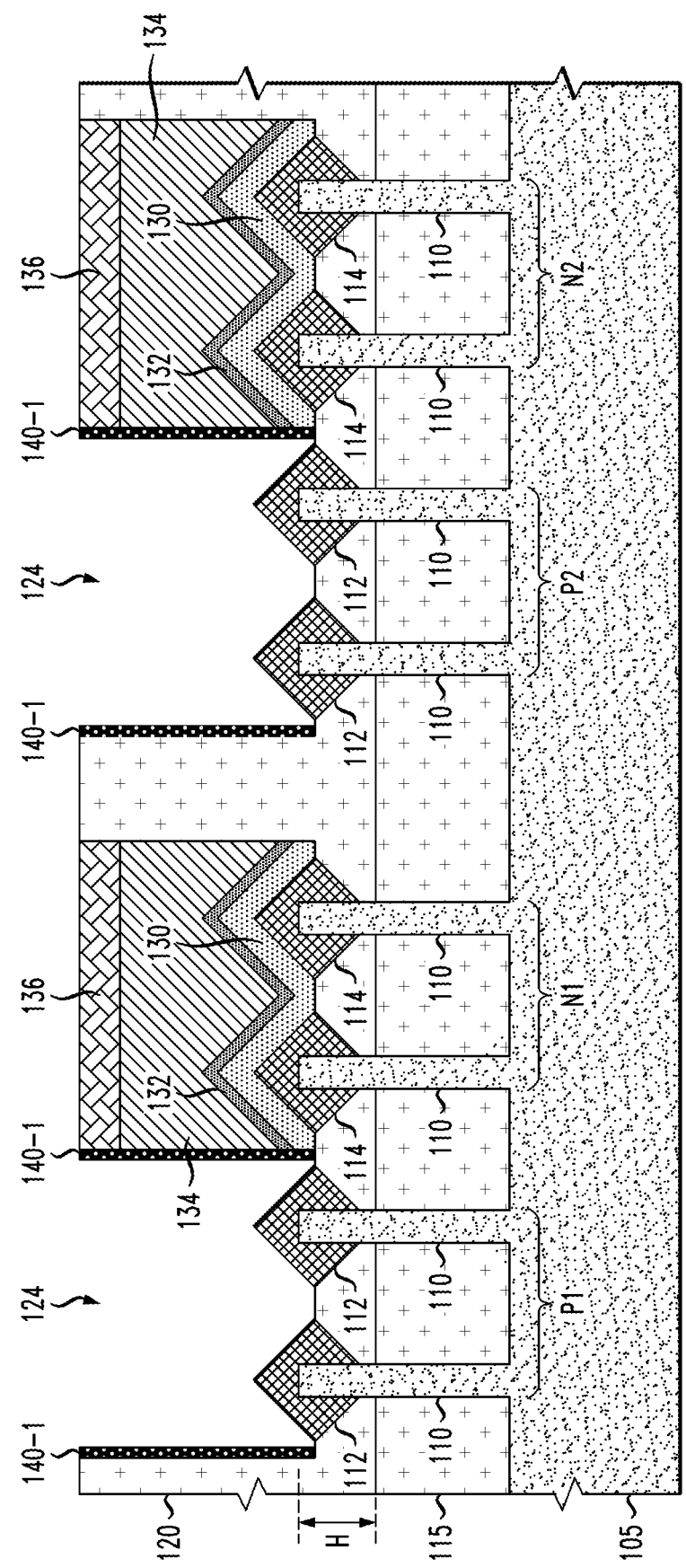

A next phase of the fabrication process comprises forming sacrificial sidewall spacers on the sidewalls of the contact openings 124 using a process flow as schematically illustrated in FIGS. 5 and 6. For example, FIG. 5 is a schematic cross-sectional side view of the semiconductor device of FIG. 4 after forming a thin conformal sacrificial spacer layer 140 over the surface of the semiconductor device. The sacrificial spacer layer 140 is formed using an insulating/dielectric material which can be etched selective to the ILD layer 120 and the capping layers 136. For example, when the ILD layer 120 is formed of an oxide and the capping layers 136 are formed of SiN, the sacrificial spacer layer 140 can be formed of, e.g., SiBCN. The sacrificial spacer layer 140 is deposited using CVD, PVD or ALD, for example. The sacrificial spacer layer 140 is formed with a thickness in a range of about 2 nm to about 10 nm.

Next, FIG. 6 is a schematic cross-sectional side view of the semiconductor device of FIG. 5 after patterning the conformal sacrificial spacer layer 140 to form sacrificial sidewall spacers 140-1 on the sidewalls of the contact openings 124. The sacrificial sidewall spacers 140-1 are formed by etching the conformal sacrificial spacer layer 140 using a directional (anisotropic) dry etch process (e.g., directional RIE), to etch away the conformal sacrificial spacer layer 140 except for the vertical portions of the conformal sacrificial spacer layer 140 on the sidewalls of the contact openings 124. In this process, the conformal sacrificial spacer layer 140 is etched selective to the ILD layer 120, the capping layers 136, and the source/drain layers 112.

Figure 7:
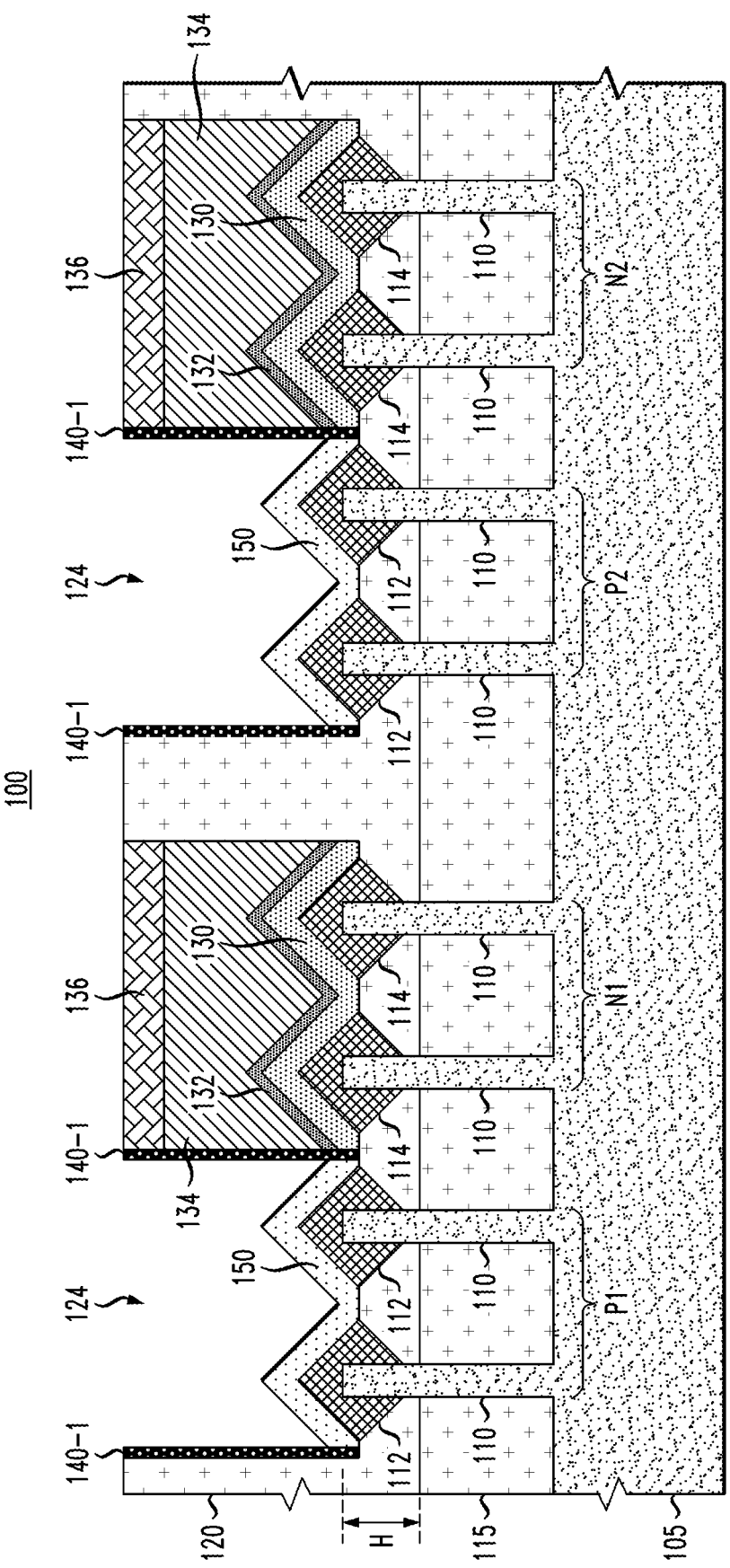

Next, FIG. 7 is a schematic cross-sectional side view of the semiconductor device of FIG. 6 after forming second epitaxial contact layers 150 on the source/drain layers 112 exposed within the contact openings 124 of the ILD layer 120. The second epitaxial contact layers 150 comprise epitaxial material that is epitaxially grown on the source/drain layers 124 of the PFET devices P1 and P2. Prior to forming the second epitaxial contact layers 150, a preclean process can be performed to remove any surface impurities or oxides from the exposed surfaces of the epitaxial source/drain layers 112, which would otherwise increase the contact resistance or resistivity of the resulting trenches silicide contacts. In one embodiment, the second epitaxial contact layers 150 are formed of an epitaxial material which is the same or similar to the epitaxial material of the source/drain layers 112, but with possible higher doping levels than the source/drain layers 112. For example, in one embodiment, the second epitaxial contact layers 150 are formed of epitaxial SiGe material, but with increased doping levels to enable the formation of lower resistivity silicide contacts. The second epitaxial contact layers 150 can be formed using methods such as those methods noted above for growing the source/drain layers 112 and 114.

Figure 8:
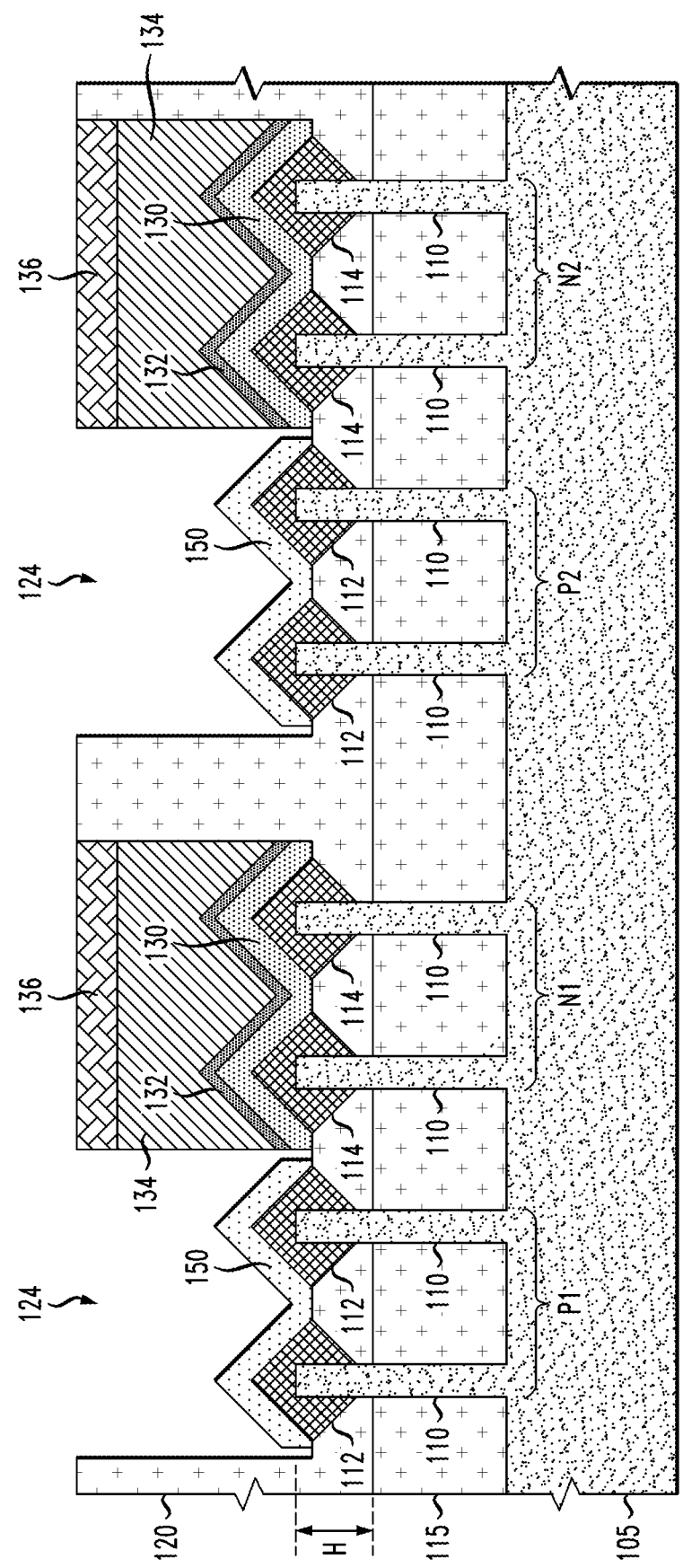

Next, FIG. 8 is a schematic cross-sectional side view of the semiconductor device of FIG. 7 after removing the sacrificial sidewall spacers 140-1 on the sidewalls of the contact openings 124. In one embodiment, the sacrificial sidewall spacers 140-1 are removed using a wet etch process with an etching solution configured to each the material of the sacrificial sidewall spacers 140-1 selective to the ILD layer 120 and other surrounding materials.

Figure 9:
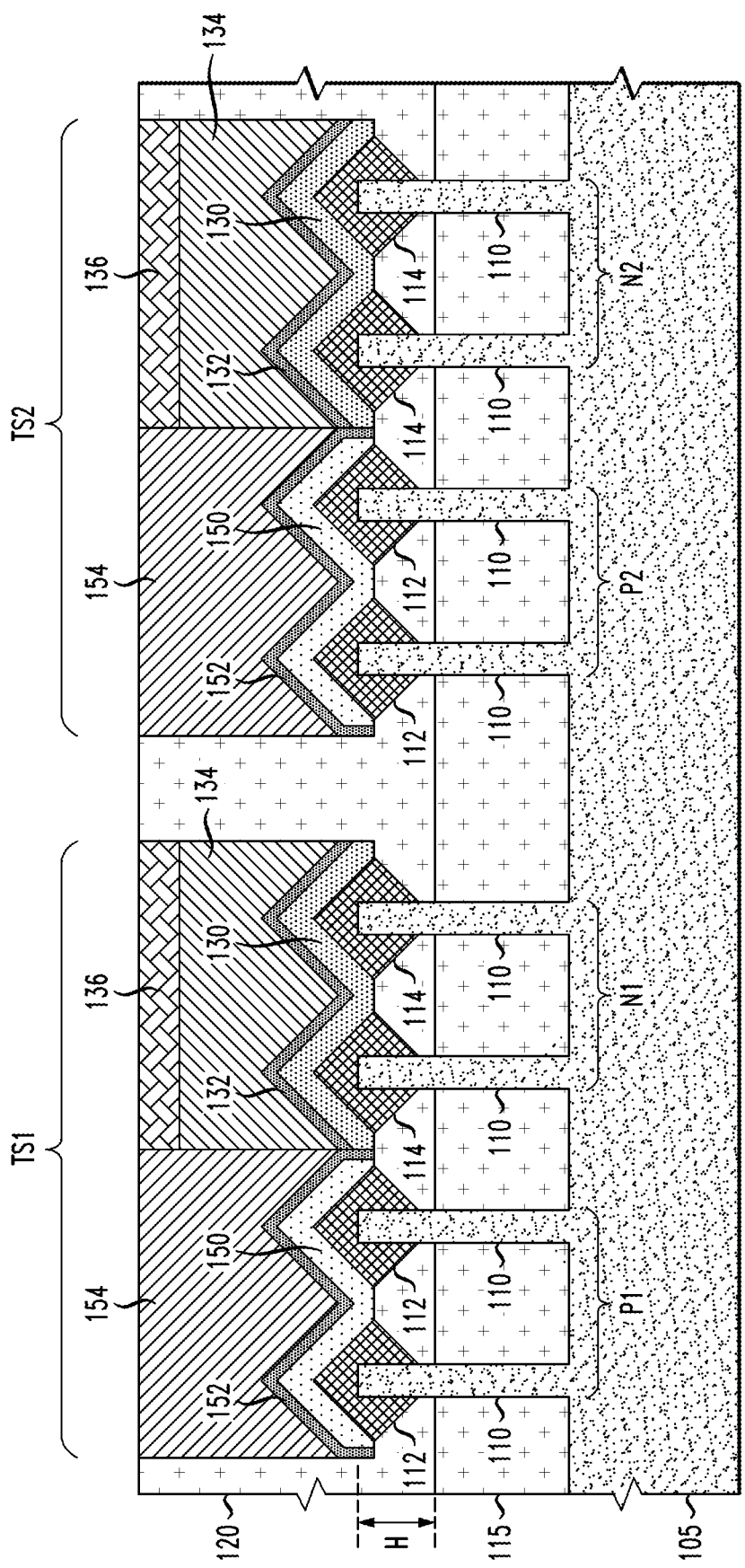

Next, FIG. 9 is a schematic cross-sectional side view of the semiconductor device of FIG. 8 after forming a second metallic contact liner layer 152 and a second metallic fill layer 154 within each of the contact openings 124 of the ILD layer 120 to form first and second shared contact trenches TS1 and TS2. The second metallic contact liner layers 152 each comprise a thin layer of metallic material which, during a subsequent thermal anneal process, combines with the second epitaxial contact layers 150 to form trench silicide layers (or metallic-semiconductor alloy layers) as part of a salicidation process. For the PFET devices P1 and P2, the second metallic contact liner layers 152 can be formed of, e.g., nickel platinum (NiPt) or cobalt (Co), or any other suitable metallic material to form silicide contacts for the PFET devices P1 and P2. According to a non-limiting embodiment of the present invention, the second metallic contact liner layers 152 are formed with a thickness in a range of about 1 nm to about 5 nm.

With this exemplary process flow, the second metallic contact liner layers 152 (or silicide metal) are deposited right after formation of the second epitaxial contact layers 150, which essentially enables the formation of a residue-free and defect-free epitaxial surface on which the silicide metal is deposited. The second metallic contact liner layers 152 can be deposited via ALD or CVD (in which case the second metallic contact liner layers 152 are conformally deposited on bottom and sidewall surfaces of the contact openings 124) or by PVD (in which case the second metallic contact liner layers 152 are essentially deposited on the bottom of the contact openings 124).

The metallic fill layer 154 comprises a metallic material which is deposited to fill the contact openings 124. The metallic fill layer 154 comprises a metallic material including, but not limited to, tungsten, cobalt, ruthenium, copper, or combinations thereof. The metallic fill layer 154 is formed by depositing metallic material using deposition techniques such as CVD, PECVD, PVD, ALD, RFCVD, ALD, MBD, PLD, LSMCD, sputtering, and/or plating. Furthermore, in some embodiments, before forming the metallic fill layer 154, a barrier layer and/or seed layer is conformally deposited to line the sidewall and bottom surfaces of the contact openings 124. For example, in one embodiment, for the contact trenches of the PFET devices P1 and P2, the barrier layer (or seed layer) is formed of a metallic material such as Ti and/or TiN. The barrier layer may be formed with a thickness in a range of about 3 nm to about 8 nm thick. The barrier layer serves to prevent the diffusion of metallic material from the metallic fill layer 154 into the ILD layer 120. A seed layer serves as a wetting layer for the metallic fill deposition process.

Following the metal deposition processes to form the metallic layers 132 and 134 (and the optional diffusion barrier layer), a planarization process (e.g., CMP process) is performed to remove the overburden metallic material from the upper surface of the ILD layer 120, which results in the semiconductor structure shown in FIG. 9. At the intermediate stage of the process as shown in FIG. 9, the shared contact trench TS1 for the source/drain layers 112 and 114 of the first PFET and NFET devices P1 and N1 is completely filled with metallization, and the shared contact trench TS2 for the source/drain layers 112 and 114 of the second PFET and NFET devices P2 and N2 is completely filled with metallization.

Figure 10:
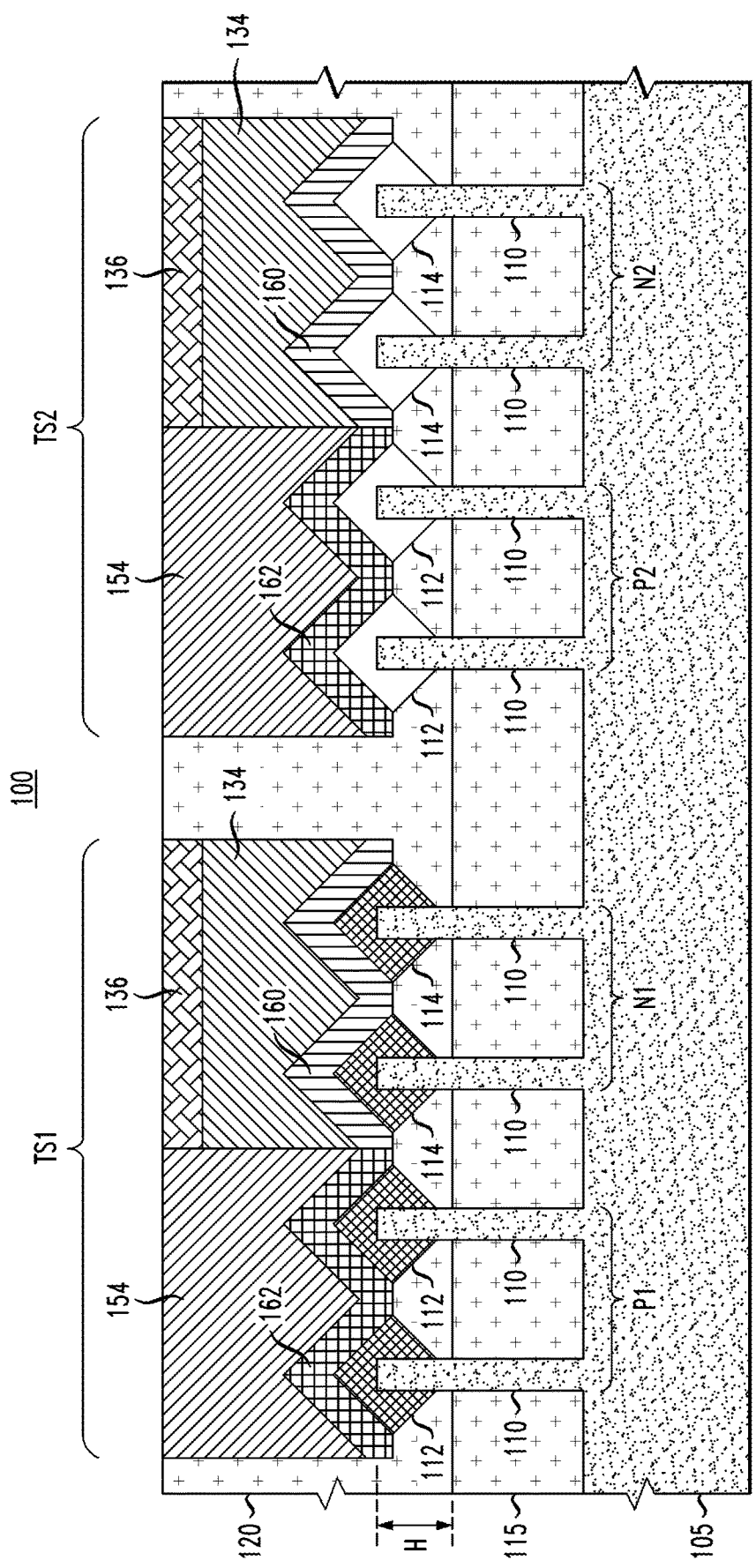

Following the fabrication of the first and second shared contact trenches TS1 and TS2, a thermal anneal process is performed at an appropriate temperature to induce a reaction between the materials of the first and second epitaxial contact layers 130 and 150 and the first and second metallic contact liner layers 132 and 152, respectively, to form metal-semiconductor alloy regions (or silicide layers) within the shared contact trenches TS1 and TS2. For example, FIG. 10 is a schematic cross-sectional side view of the semiconductor device of FIG. 9 after performing a thermal anneal process to form first and second silicide contact layers 160 and 162 in each of the first and second shared contact trenches TS1 and TS2. In particular, within the shared contact trenches TS1 and TS2, the metallic material of the first metallic contact liner layers 132 reacts with at least a portion (or all) of the epitaxial semiconductor material of the first epitaxial contact layers 130 to form the first silicide contact layers 160, and the metallic material of the second metallic contact liner layers 152 reacts with at least a portion (or all) of the epitaxial semiconductor material of the second epitaxial contact layers 150 to form the second silicide contact layers 162.

It is to be understood that FIG. 10 schematically illustrates one exemplary embodiment in which all of the material of the first and second epitaxial contact layers 130 and 150 is combined with metallic material of the respective first and second metallic contact liner layers 132 and 152 to form silicide material of the first and second silicide contact layers 160 and 162. In other embodiments, a thin (remaining) interfacial layer of the first and second epitaxial contact layers 130 and 150 may remain between the first and second silicide layers 160 and 162 and the source/drain layers 114 and 112 at the completion of the salicidation process. Moreover, some of the metallic material (e.g., Ti) of the barrier layer may combine with the first and second epitaxial contact layers 130 and 150 to form the first and second silicide layers 160 and 162.

It is to be further understood that FIGS. 1-10 illustrate an exemplary process flow in which the epitaxial contact layers 130, the metallic contact liner layers 132, and the metallic fill layers 134 for the NFET regions of the shared contact trenches TS1 and TS2 are formed first, followed by formation of the epitaxial contact layers 150, the metallic contact liner layers 152, and the metallic fill layers 154 for the PFET regions of the shared contact trenches TS1 and TS2. However, in an alternate embodiment, the order of the process flow can be reversed such the epitaxial contact layers 150, the metallic contact liner layers 152, and the metallic fill layers 154 for the PFET regions of the shared contact trenches TS1 and TS2 are formed first, followed by formation of the epitaxial contact layers 130, the metallic contact liner layers 132, and the metallic fill layers 134 for the NFET regions of the shared contact trenches TS1 and TS2.

In all exemplary embodiments, each shared contact trench TS1 and TS2 comprises two different types of silicide contact layers 160 and 162 (i.e., dual silicide contact layers). For example, the silicide contact layers 160 for the NFET devices N1 and N2 may comprise a titanium silicide, while the silicide contact layers 162 of the PFET devices P1 and P2 may comprise nickel silicide, a platinum silicide, nickel-platinum silicide, cobalt silicide, etc. The process flow described above allows for fabrication of shared contact trenches for NFET and PFET devices for CMOS circuitry (e.g., SRAM) wherein the shared contact trenches have dual silicide and epitaxial contact layers to optimize the contact resistance to source/drain layers of NFETs and PFETs within the shared contact trenches TS1 and TS2.

Following the formation of the semiconductor structure shown in FIG. 10, middle-of-the-line (MOL) processing continues using known materials and fabrication techniques to form MOL contacts, such as vertical gate, source, and drain contacts, and other device contacts to active and/or passive components formed as part of front-end-of-line (FEOL) layer, the details of which are not necessary for one of ordinary skill in the art to understand embodiments of the invention as discussed herein. In addition, following the MOL process module, a BEOL (back end of line) process module is performed using known materials and fabrication techniques to form a BEOL interconnect structure to provide connections between the FinFET devices and other active or passive devices that are formed as part of the FEOL layer, the details of which are not necessary for one of ordinary skill in the art to understand embodiments of the invention as discussed herein.

FIGS. 11-20 schematically illustrate a method for fabricating shared contact trenches for NFET and PFET devices, which comprise dual silicide layers and dual epitaxial contact layers, according to another embodiment of the invention. In some embodiments, the fabrication process schematically illustrated in FIGS. 11-20 utilizes the same or similar structures, materials, deposition techniques, and patterning techniques for the fabrication process described above for FIGS. 1-10. Thus, for ease and brevity of explanation, such details will not be repeated below.

Figure 11:
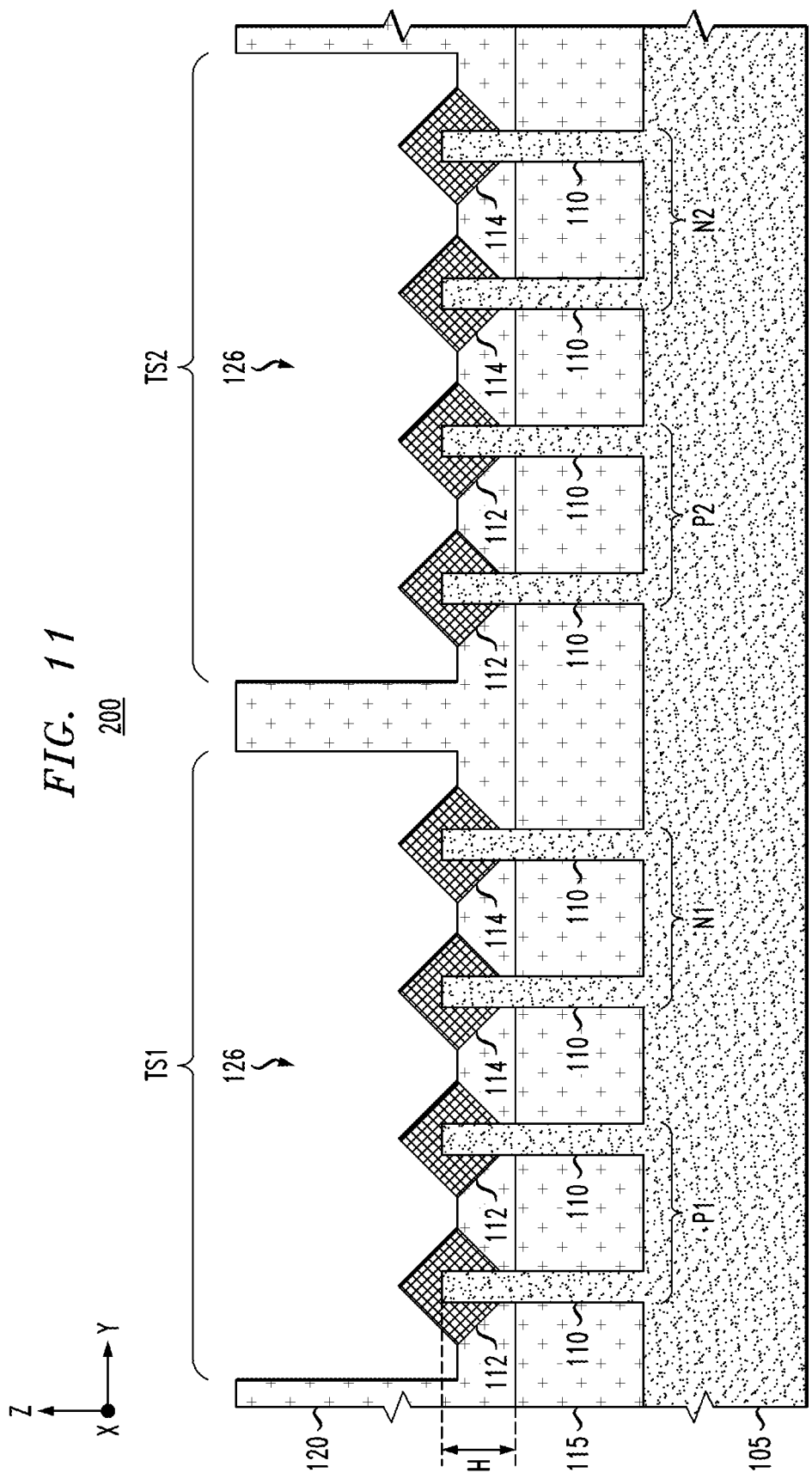

To begin, FIG. 11 is a schematic cross-sectional side view of a semiconductor device 200 at an intermediate stage of fabrication comprising a semiconductor substrate 105, a plurality of PFET devices P1 and P2 and NFET devices N1 and N2 comprising vertical semiconductor fins 110 and epitaxial source/drain layers 112 and 114 formed on upper regions of the vertical semiconductor fins 110, an isolation layer 115, an ILD layer 120, and a plurality of contact openings 126 formed in the ILD layer 120 to expose the source/drain layers 112 of the PFET devices P1 and P2 and the source/drain layers 114 of the NFET devices N1 and N2. FIG. 11 is similar in structure and materials to the intermediate structure of the semiconductor device 100 shown and discussed above with reference to FIG. 1, expect that in the exemplary embodiment of FIG. 11, the contact openings 126 are formed in the ILD layer 120 to expose all the source/drain layers 112 and 114 of the PFET device P1 and P2 and the NFET devices N1 and N2. In particular, the initial contact openings 126 in the ILD layer 120 define the width and depth of the shared contact trenches TS1 and TS2.

Figure 12:
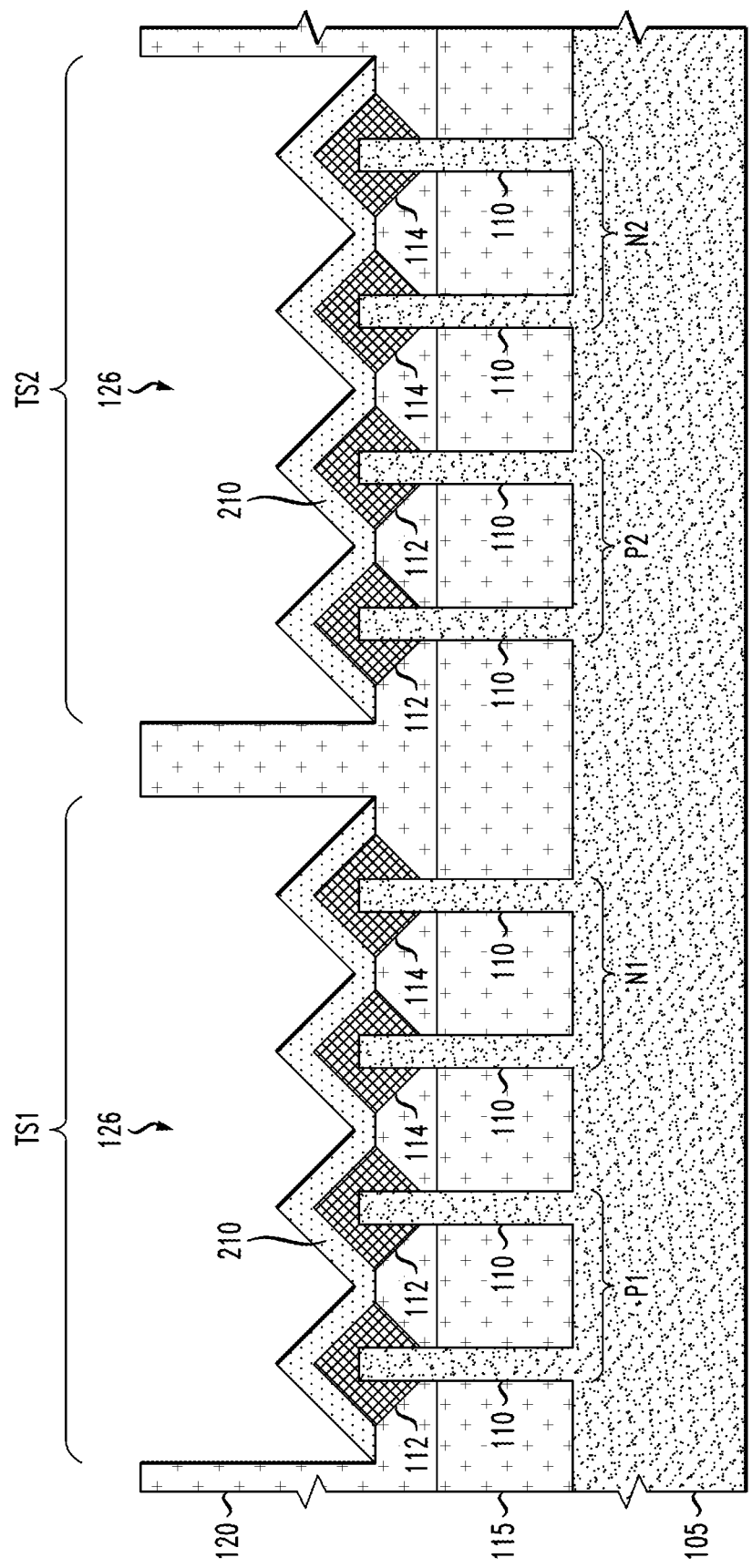

FIG. 12 is a schematic cross-sectional side view of the semiconductor device of FIG. 11 after forming first epitaxial contact layers 210 on the source/drain layers 112 and 114 of the PFET and NFET devices exposed at the bottom of the contact openings 126 of the ILD layer 120. In one embodiment, the first epitaxial contact layers 210 comprise epitaxial material (e.g., SiGe) that is epitaxially grown on the source/drain layers 112 of the PFET devices P1 and P2 and on the source/drain layers 114 of the NFET devices N1 and N2. Prior to forming the first epitaxial contact layers 210, a preclean process can be performed to remove any surface impurities or oxides from the exposed surfaces of the epitaxial source/drain layers 112 and 114. In one embodiment, the first epitaxial contact layers 210 are formed of an epitaxial material which is the same or similar to the epitaxial material of the source/drain layers 112 of the PFET devices P1 and P2, but with possible higher doping levels than the source/drain layers 112. In this regard, in one exemplary embodiment, the first epitaxial contact layers 210 are utilized to form silicide contacts for the PFET devices P1 and P2 within the shared contact trenches TS1 and TS2.

Figure 13:
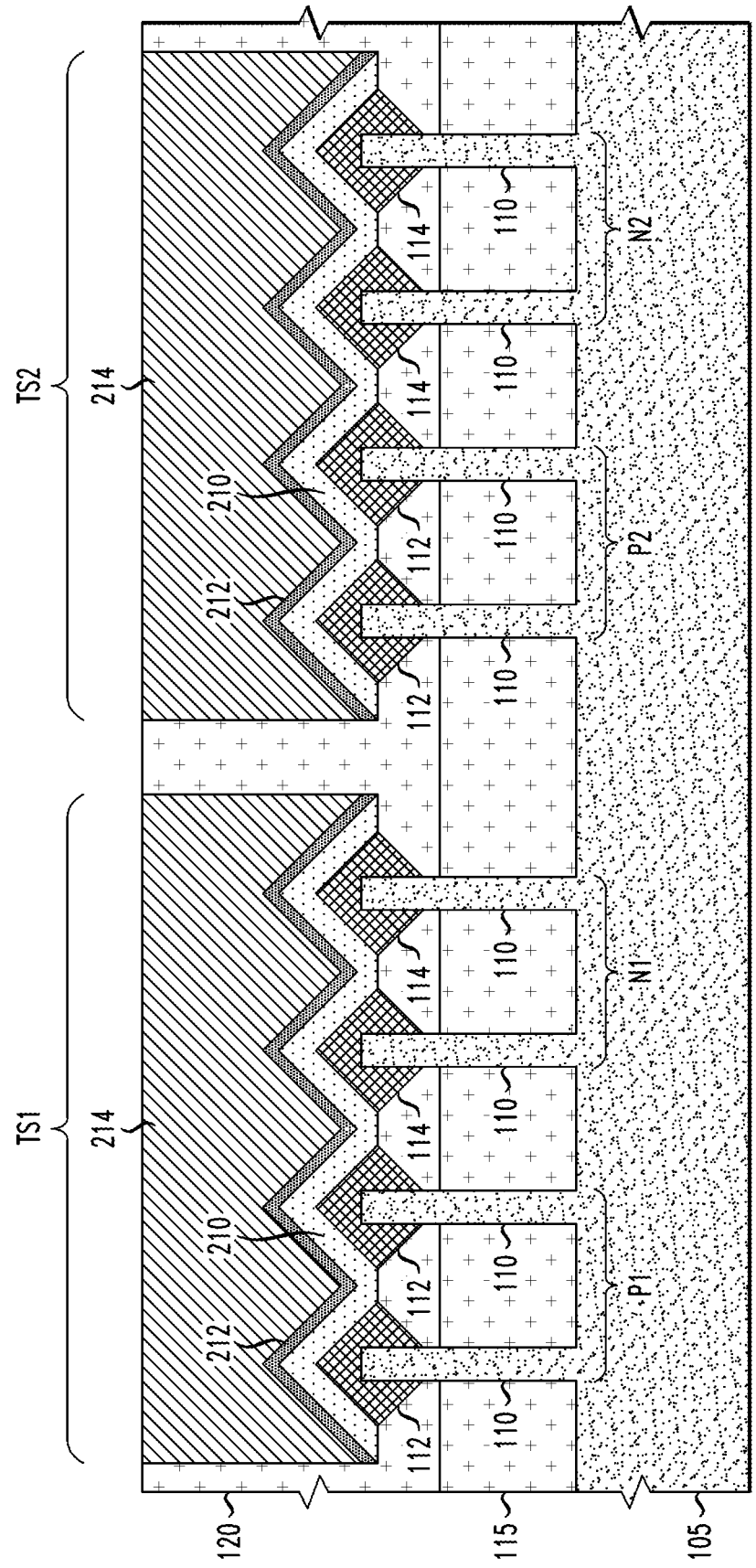

FIG. 13 is a schematic cross-sectional side view of the semiconductor device of FIG. 12 after forming a first metallic contact liner layer 212 and a first metallic fill layer 214 within the contact openings 126 of the ILD layer 120 to form shared contact trenches TS1 and TS2. In one embodiment, the first metallic contact liner layers 212 are utilized to form silicide contacts for the PFET devices P1 and P2 within the shared contact trenches TS1 and TS2. As such, the first metallic contact liner layers 212 are formed of e.g., nickel platinum or cobalt, or any other metallic material which is suitable for use combining with the material of the first epitaxial contact layer 210 to form silicide contacts for the PFET devices P1 and P2. With this exemplary process flow, the first metallic contact liner layers 212 are deposited right after formation and pre-cleaning of the first epitaxial contact layers 210, which essentially enables the formation of a residue-free and defect-free epitaxial surface on which the silicide metal is deposited. The first metallic fill layer 214 is formed of, e.g., tungsten, cobalt, ruthenium, copper, etc. In addition, a thin barrier/seed layer can be formed within the contact openings 126 prior to formation of the first metallic fill layer 214.

Figure 14:
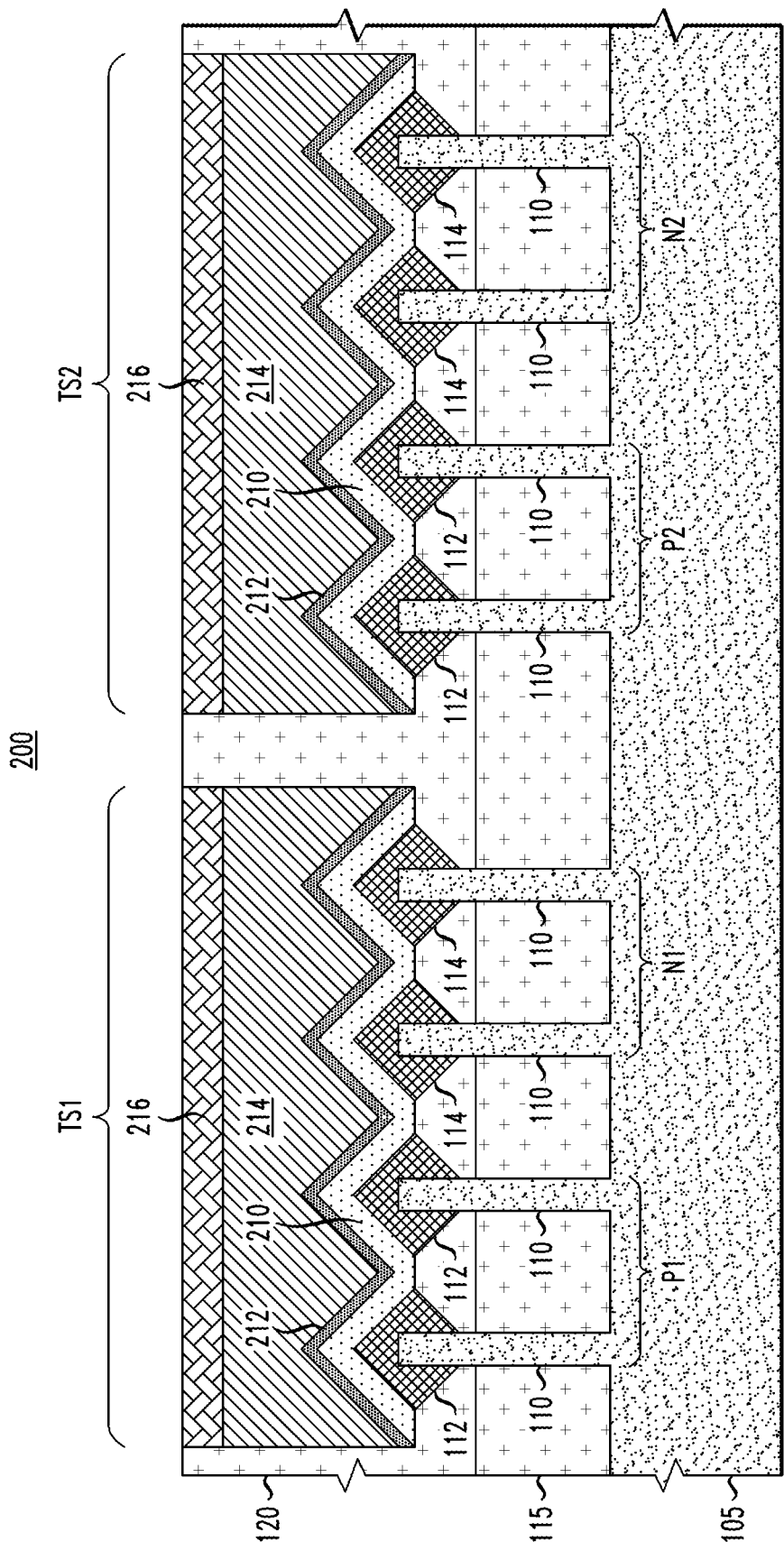

Next, FIG. 14 is a schematic cross-sectional side view of the semiconductor device of FIG. 13 after recessing the metallic fill layers 214 and forming capping layers 216 on recessed surfaces of the metallic fill layers 214. The capping layers 216 are formed using the same or similar materials and fabrication methods as discussed above for fabrication the capping layers 136 of FIG. 3.

Figure 15:
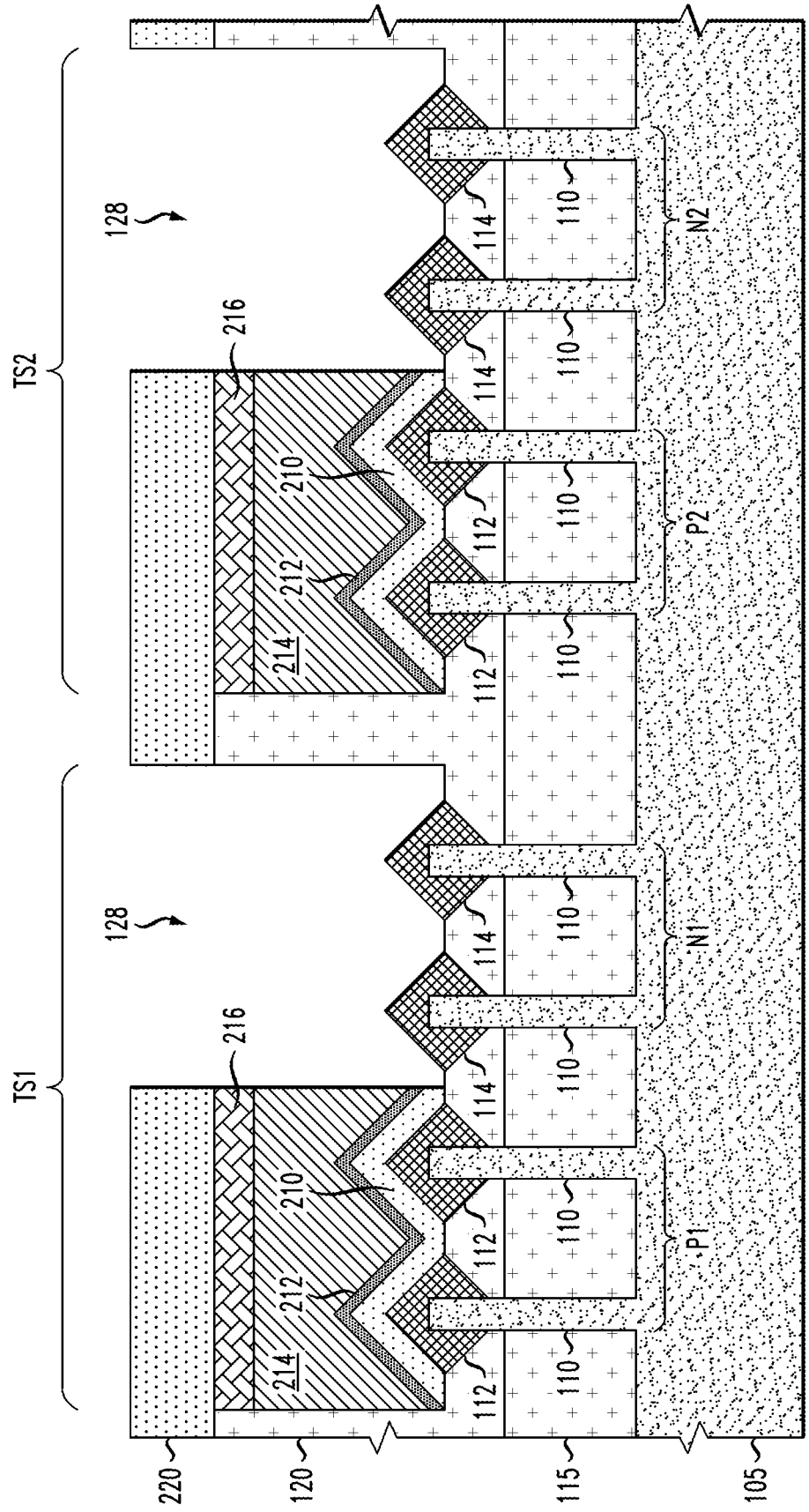

FIG. 15 is a schematic cross-sectional side view of the semiconductor device of FIG. 14 after forming contact openings 128 in the shared contact trenches TS1 and TS2 to expose the source/drain layers 114 of the NFET devices N1 and N2. In one embodiment, the contact openings 128 are formed by a process which comprises (i) performing a photolithographic process to form a photoresist mask 220 having an image which defines the contact openings 128, and then (ii) performing one or more sequential directional dry etch processes (e.g. RIE) to form the contact openings 128 by etching the exposed portions of the capping layer 216, the first metallic fill layer 214, the first metallic contact liner layer 212 and the epitaxial contact layer 210 down to the source/drain layers 114 of the NFET devices N1 and N2.

Figure 16:
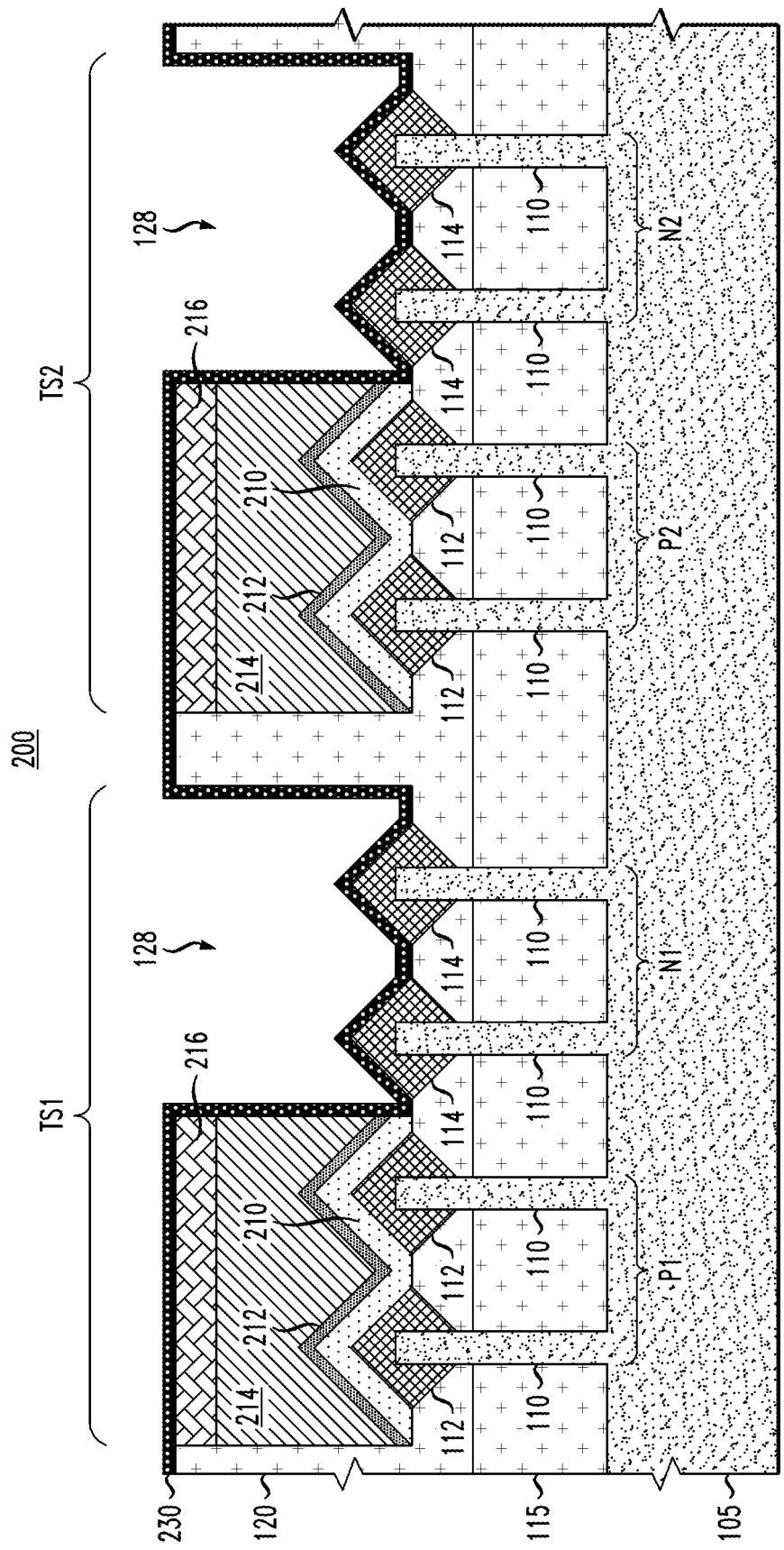

Next, FIG. 16 is a schematic cross-sectional side view of the semiconductor device of FIG. 15 after forming a thin conformal sacrificial spacer layer 230 over the surface of the semiconductor device. The conformal sacrificial spacer layer 230 is formed using the same or similar materials and fabrication methods as discussed above for fabricating the sacrificial spacer layer 140 in FIG. 5.

Figure 17:
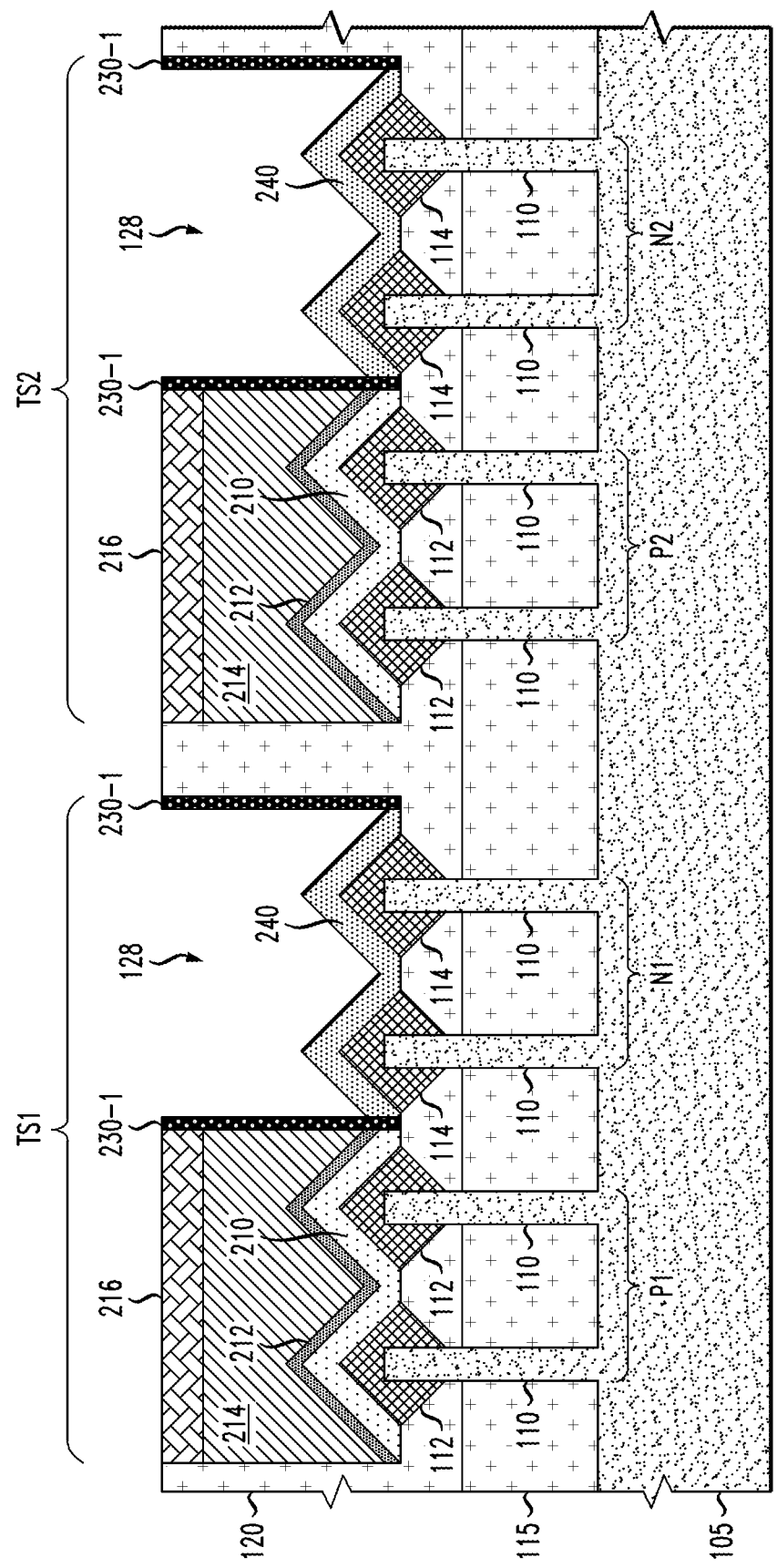

FIG. 17 is a schematic cross-sectional side view of the semiconductor device of FIG. 16 after patterning the conformal sacrificial spacer layer 230 to form sacrificial sidewall spacers 230-1 on the sidewalls of the contact openings 128 of the first and second shared contact trenches TS1 and TS2, and after forming second epitaxial contact layers 240 on the source/drain layers 114 of the NFET devices N1 and N2 exposed within the contact openings 128 of the first and second shared contact trenches TS1 and TS2. The sacrificial sidewall spacers 230-1 are formed by etching the conformal sacrificial spacer layer 230 using a directional (anisotropic) dry etch process (e.g., directional RIE), selective to the ILD layer 120, the capping layers 216, and the source/drain layers 112.

In one embodiment, the second epitaxial contact layers 240 comprise epitaxial material (e.g., SiP) that is epitaxially grown on the source/drain layers 114 of the NFET devices N1 and N2. Prior to forming the second epitaxial contact layers 240, a preclean process can be performed to remove any surface impurities or oxides from the exposed surfaces of the epitaxial source/drain layers 114 of the NFET devices N1 and N2. In one embodiment, the second epitaxial contact layers 210 are formed of an epitaxial material which is the same or similar to the epitaxial material of the source/drain layers 114 of the NFET devices N1 and N2, but with possible higher doping levels than the source/drain layers 114. In this regard, in one exemplary embodiment, the second epitaxial contact layers 240 are utilized to form silicide contacts for the NFET devices N1 and N2 within the first and second shared contact trenches TS1 and TS2.

Figure 18:
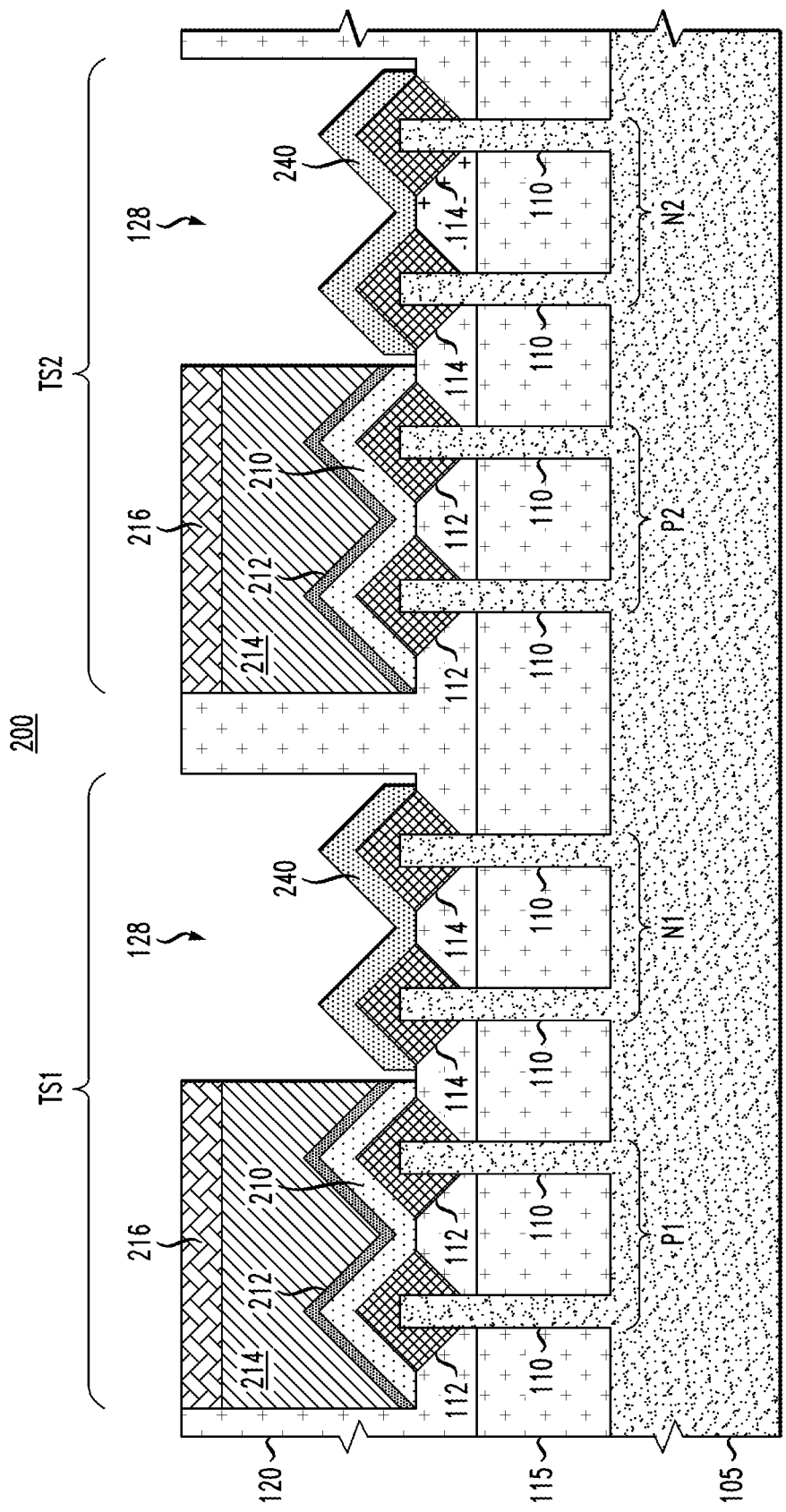

FIG. 18 is a schematic cross-sectional side view of the semiconductor device of FIG. 17 after removing the sacrificial sidewall spacers 230-1 on the sidewalls of the contact openings 128 of the first and second shared contact trenches TS1 and TS2. In one embodiment, the sacrificial sidewall spacers 230-1 are removed using a wet etch process with an etching solution configured to each the material of the sacrificial sidewall spacers 230-1 selective to the ILD layer 120 and other surrounding materials.

Figure 19:
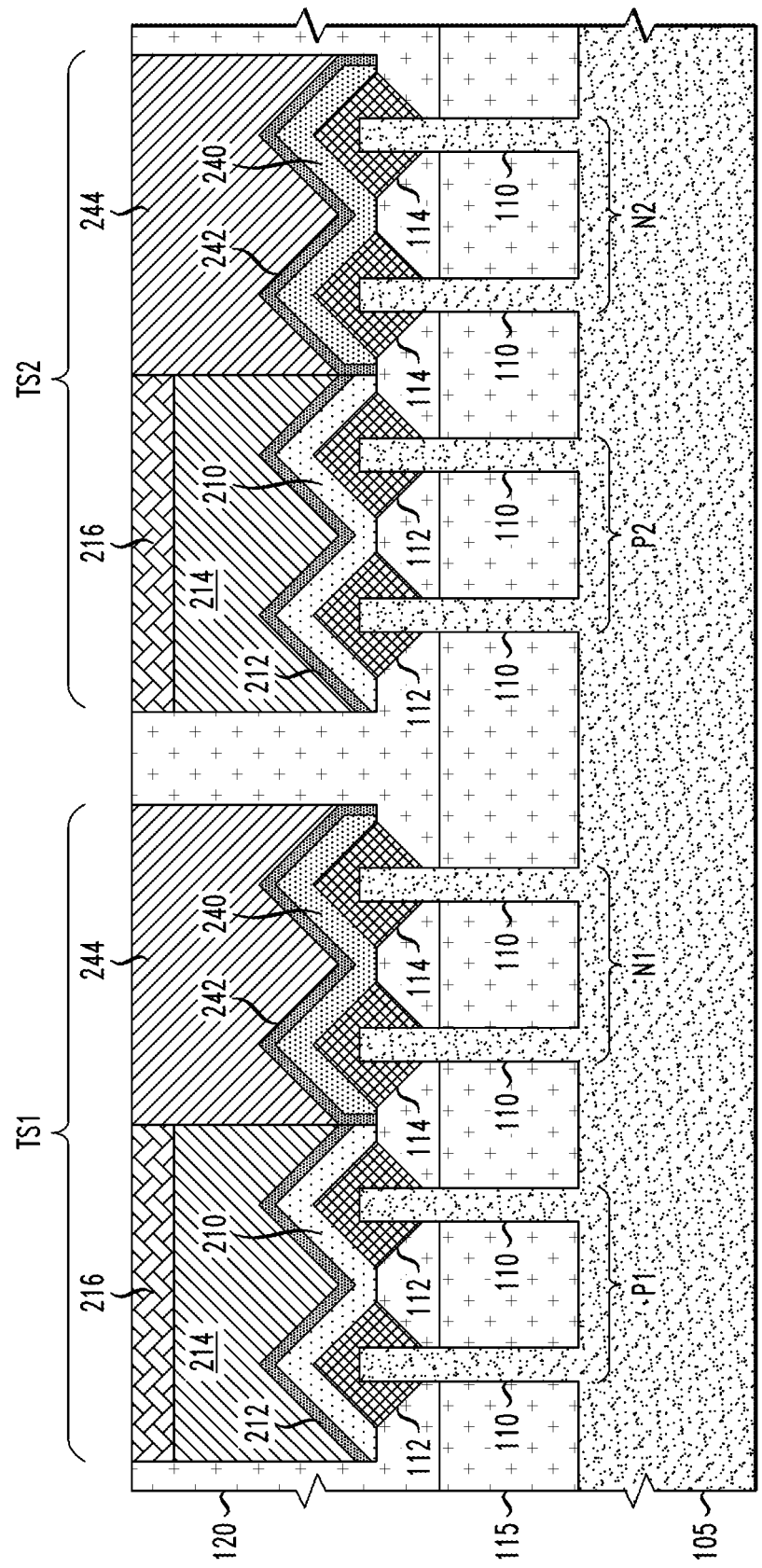

Next, FIG. 19 is a schematic cross-sectional side view of the semiconductor device of FIG. 18 after forming second metallic contact liner layers 242 and second metallic fill layers 244 over the second epitaxial contact layers 240 of the NFET devices N1 and N2 on the first and second shared contact trenches TS1 and TS2. In one embodiment, the second metallic contact liner layers 242 are utilized to form silicide contacts for the NFET devices N1 and N2 within the shared contact trenches TS1 and TS2. As such, the second metallic contact liner layers 242 are formed of e.g., Ti, TiN, or any other metallic material which is suitable for use combining with the material of the second epitaxial contact layers 240 to form silicide contacts for the source/drain layers 114 of the NFET devices N1 and N2. With this exemplary process flow, the second metallic contact liner layers 242 are deposited right after formation and pre-cleaning of the second epitaxial contact layers 240, which essentially enables the formation of a residue-free and defect-free epitaxial surface on which the silicide metal is deposited. The second metallic fill layer 244 is formed of, e.g., tungsten, cobalt, ruthenium, copper, etc., which in one embodiment, is the same material used to form the first metallic fill layer 214. In addition, a thin barrier/seed layer can be formed within the contact openings 128 prior to formation of the second metallic fill layer 244.

Figure 20:
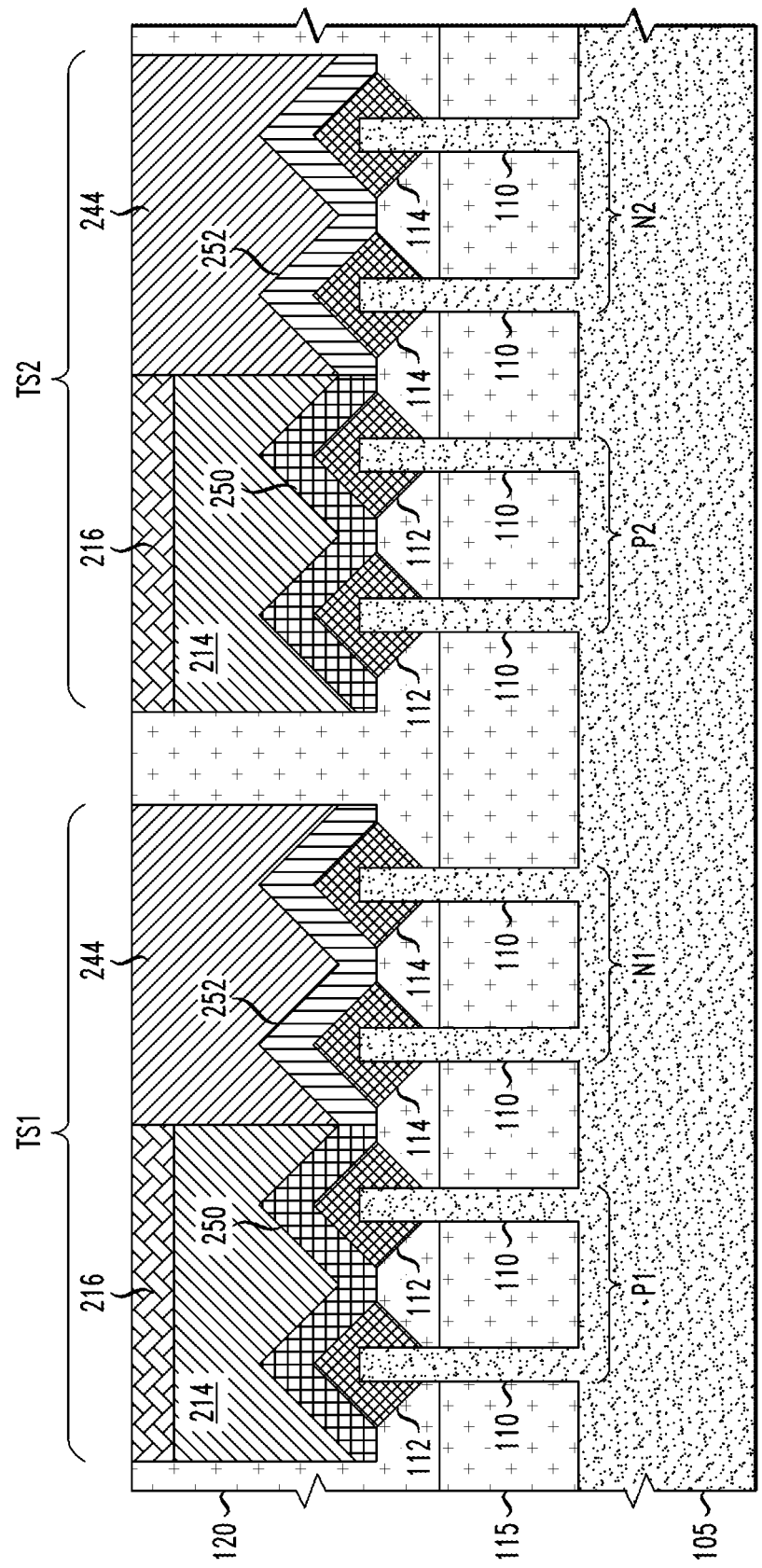

Following the fabrication of the first and second shared contact trenches TS1 and TS2, a thermal anneal process is performed at an appropriate temperature to induce a reaction between the materials of the first and second epitaxial contact layers 210 and 240 and the first and second metallic contact liner layers 212 and 242, respectively, to form metal-semiconductor alloy regions (or silicide layers) within the first and second shared contact trenches TS1 and TS2. For example, FIG. 20 is a schematic cross-sectional side view of the semiconductor device of FIG. 19 after performing a thermal anneal process to form silicide contact layers 250 and 252 in the first and second shared contact trenches TS1 and TS2. In particular, within the shared contact trenches TS1 and TS2, the metallic material of the first metallic contact liner layers 212 reacts with at least a portion (or all) of the epitaxial semiconductor material of the first epitaxial contact layers 210 to form the first silicide contact layers 250, and the metallic material of the second metallic contact liner layers 242 reacts with at least a portion (or all) of the epitaxial semiconductor material of the second epitaxial contact layers 240 to form the second silicide contact layers 252.

It is to be understood that FIG. 20 schematically illustrates one exemplary embodiment in which all of the material of the first and second epitaxial contact layers 210 and 240 is combined with metallic material of the respective first and second metallic contact liner layers 212 and 242 to form the silicide material of the first and second silicide contact layers 250 and 252. In other embodiments, a thin (remaining) interfacial layer of the first and second epitaxial contact layers 210 and 240 may remain between the silicide layers 250 and 252 and the source/drain layers 114 and 112 at the completion of the salicidation process. Moreover, some of the metallic material (e.g., Ti) of the barrier layer may combine with the first and second epitaxial contact layers 210 and 240 to form the silicide contact layers 250 and 252.

It is to be further understood that while FIGS. 11-20 illustrates an exemplary process flow in which the epitaxial contact layers 210, the metallic contact liner layers 212, and the metallic fill layers 214 for the PFET regions of the shared contact trenches TS1 and TS2 are formed first (as shown in FIG. 13), followed by forming contact openings in the shared contact trenches TS1 and TS2 to expose the NFET regions, and then forming the epitaxial contact layers 240, the metallic contact liner layers 242, and the metallic fill layers 244 for the NFET regions of the shared contact trenches TS1 and TS2 (as shown in FIGS. 18 and 19), the order of the process flow can be reversed. In particular, in an alternate embodiment, starting at the intermediate structure shown in FIG. 11, the epitaxial contact layers 240, the metallic contact liner layers 242, and the metallic fill layers 244 for the NFET regions can be formed within the entire contact openings 126 for the shared contact trenches TS1 and TS2, followed by forming contact openings in the shared contact trenches TS1 and TS2 to expose the PFET regions, and then forming the epitaxial contact layers 210, the metallic contact liner layers 212, and the metallic fill layers 214 for the PFET regions of the shared contact trenches TS1 and TS2.

Again, in all exemplary embodiments, each shared contact trench TS1 and TS2 comprises two different types of silicide contact layers 250 and 252 (i.e., dual silicide contact layers). For example, the first silicide contact layers 250 for the source/drain layers 112 of the PFET devices P1 and P2 may comprise nickel silicide, a platinum silicide, cobalt silicide, etc., while the second silicide contact layers 252 for the source/drain layers 114 of the NFET devices N1 and N2 may comprise a titanium silicide, etc. The process flow described above in FIGS. 11-20 allows for fabrication of shared contact trenches for NFET and PFET devices for CMOS circuitry (e.g., SRAM) wherein the shared contact trenches have dual silicide and epitaxial contact layers to optimize the contact resistance to source/drain layers of NFET and PFET devices within the shared contact trenches TS1 and TS2.

Following the formation of the semiconductor structure shown in FIG. 20, MOL processing continues using known materials and fabrication techniques to form MOL contacts, such as vertical gate, source, and drain contacts, and other device contacts to active and/or passive components formed as part of a FEOL layer, the details of which are not necessary for one of ordinary skill in the art to understand embodiments of the invention as discussed herein. In addition, following the MOL process module, a BEOL process module is performed using known materials and fabrication techniques to form a BEOL interconnect structure to provide connections between the FinFET devices and other active or passive devices that are formed as part of the FEOL layer, the details of which are not necessary for one of ordinary skill in the art to understand embodiments of the invention as discussed herein.

It is to be understood that the methods discussed herein for fabricating shared contact trenches for NFET and PFET devices, which comprise dual silicide layers and dual epitaxial contact layers, can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A semiconductor device comprising:
  a first field-effect transistor device and a second field-effect transistor device disposed on a substrate, wherein the first field-effect transistor device comprises a first source/drain layer, and wherein the second field-effect transistor device comprises a second source/drain layer;
  a shared contact trench, wherein the first and second source/drain layers are disposed adjacent to each other within the shared contact trench, and are commonly connected to each other by the shared contact trench;
  wherein the shared contact trench comprises:
  a first silicide contact layer disposed on the first source/drain layer of the first field-effect transistor device;
  a second silicide contact layer disposed on the second source/drain layer of the second field-effect transistor device, wherein the first and second silicide contact layers comprise different silicide materials; and
  a metallic fill layer disposed on the first and second silicide contact layers.

2. The semiconductor device of claim 1, wherein the first and second field-effect transistor devices comprise n-type and p-type fin field-effect transistor devices.

3. The semiconductor device of claim 2, wherein the first and second source/drain layers are disposed on adjacent vertical semiconductor fins of the first and second field-effect transistor devices.

4. The semiconductor device of claim 1, wherein one of the first and second silicide contact layers comprises titanium silicide, and wherein the other of the first and second silicide contact layers comprises one of nickel silicide, a platinum silicide, nickel-platinum silicide, and cobalt silicide.

5. The semiconductor device of claim 1, wherein the metallic fill material comprises at least one of tungsten, ruthenium, cobalt, and copper.

6. The semiconductor device of claim 1, wherein the first and second source/drain layers comprise epitaxial layers.

7. The semiconductor device of claim 6, wherein at least one of the first source/drain layer and the second source/drain layer comprises a silicon-germanium epitaxial material.

8. The semiconductor device of claim 6, wherein at least one of the first source/drain layer and the second source/drain layer comprises a silicon-phosphorus epitaxial material.

9. The semiconductor device of claim 1, wherein:
the first silicide contact layer comprises a first metal-semiconductor alloy layer that is formed by combining a first epitaxial semiconductor contact layer and a first metallic contact layer through a thermal annealing process, wherein the first epitaxial semiconductor contact layer is epitaxially grown on the first source/drain layer and wherein the first metallic contact layer is deposited on the first epitaxial semiconductor contact layer; and
the second silicide contact layer comprises a second metal-semiconductor alloy layer that is formed by combining a second epitaxial semiconductor contact layer and a second metallic contact layer through the thermal annealing process, wherein the second epitaxial semiconductor contact layer is epitaxially grown on the second source/drain layer and wherein the second metallic contact layer is deposited on the second epitaxial semiconductor contact layer.

10. The semiconductor device of claim 9, wherein the first epitaxial semiconductor contact layer comprises a boron-doped silicon germanium epitaxial material, and wherein the first metallic contact layer comprises one of nickel platinum and cobalt.

11. The semiconductor device of claim 9, wherein the second epitaxial semiconductor contact layer comprises one of a silicon phosphorous epitaxial material and a silicon arsenide epitaxial material, and wherein the second contact layer comprises one of titanium and titanium nitride.

12. The semiconductor device of claim 1, further comprising an insulating capping layer disposed on the metallic fill layer.

13. A semiconductor device comprising:
a shared contact trench comprising a first source/drain layer and a second source/drain layer, wherein the first and second source/drain layers are commonly connected to each other by the shared contact trench;
wherein the shared contact trench comprises:
a first silicide contact layer disposed on the first source/drain layer;
a second silicide contact layer disposed on the second source/drain layer, wherein the first and second silicide contact layers comprise different silicide materials; and
a metallic fill layer disposed on the first and second silicide contact layers.

14. The semiconductor device of claim 13, wherein the first and second source/drain layers are disposed on adjacent vertical semiconductor fins of first and second field-effect transistor devices.

15. The semiconductor device of claim 13, wherein one of the first and second silicide contact layers comprises titanium silicide, and wherein the other of the first and second silicide contact layers comprises one of nickel silicide, a platinum silicide, nickel-platinum silicide, and cobalt silicide.

16. The semiconductor device of claim 13, wherein the metallic fill material comprises at least one of tungsten, ruthenium, cobalt, and copper.

17. The semiconductor device of claim 13, wherein the first and second source/drain layers comprise epitaxial layers.

18. The semiconductor device of claim 17, wherein:
the first source/drain layer comprises a silicon-germanium epitaxial material; and
the second source/drain layer comprises one of a silicon-phosphorus epitaxial material and a silicon arsenide epitaxial material.

19. The semiconductor device of claim 13, wherein:
the first silicide contact layer comprises a first metal-semiconductor alloy layer that is formed by combining a first epitaxial semiconductor contact layer and a first metallic contact layer through a thermal annealing process, wherein the first epitaxial semiconductor contact layer is epitaxially grown on the first source/drain layer and wherein the first metallic contact layer is deposited on the first epitaxial semiconductor contact layer; and
the second silicide contact layer comprises a second metal-semiconductor alloy layer that is formed by combining a second epitaxial semiconductor contact layer and a second metallic contact layer through the thermal annealing process, wherein the second epitaxial semiconductor contact layer is epitaxially grown on the second source/drain layer and wherein the second metallic contact layer is deposited on the second epitaxial semiconductor contact layer.

20. The semiconductor device of claim 19, wherein:
the first epitaxial semiconductor contact layer comprises a boron-doped silicon germanium epitaxial material, and wherein the first metallic contact layer comprises one of nickel platinum and cobalt; and
the second epitaxial semiconductor contact layer comprises one of a silicon phosphorous epitaxial material and a silicon arsenide epitaxial material, and wherein the second contact layer comprises one of titanium and titanium nitride.

\* \* \* \* \*